US012609159B2

(12) United States Patent
Ezzadeen et al.

(10) Patent No.: US 12,609,159 B2
(45) Date of Patent: Apr. 21, 2026

(54) NEUROMORPHIC CIRCUIT BASED ON 2T2R RRAM CELLS

(71) Applicants:Commissariat à l'énergie atomique et aux énergies alternatives, Paris (FR); Centre national de la recherche scientifique, Paris (FR); Université d'Aix-Marseille, Marseilles (FR)

(72) Inventors: Mona Ezzadeen, Grenoble (FR); Jean-Philippe Noel, Grenoble (FR); Bastien Giraud, Grenoble (FR); Jean-Michel Portal, Saint Savournin (FR); François Andrieu, Grenoble (FR)

(73) Assignees: Commissariat à l'énergie atomique et aux énergies alternatives, Paris (FR); Centre national de la recherche scientifique, Paris (FR); Université d'Aix-Marseille, Marseilles (FR)

( * ) Notice: Subject to any disclaimer, the term of this patent is extended or adjusted under 35 U.S.C. 154(b) by 916 days.

(21) Appl. No.: 17/891,308

(22) Filed: Aug. 19, 2022

(65) Prior Publication Data

US 2023/0059091 A1     Feb. 23, 2023

(30) Foreign Application Priority Data

Aug. 20, 2021     (FR) ...................................... 21 08809

(51) Int. Cl.
G11C 11/54        (2006.01)
G06N 3/063        (2023.01)
(Continued)

(52) U.S. Cl.
CPC .............. G11C 11/54 (2013.01); G06N 3/063 (2013.01); G11C 13/003 (2013.01); G11C 13/0038 (2013.01); H03K 3/037 (2013.01)

(58) Field of Classification Search
CPC ..... G11C 11/54; G11C 13/003; G11C 3/0038; G06N 3/063; G06N 3/0495; H03K 3/037
(Continued)

(56) References Cited

U.S. PATENT DOCUMENTS

| 10,784,313 B1 * | 9/2020 | Gong ...................... G11C 11/54 |
| 2003/0011944 A1 * | 1/2003 | Hosomi ............... G01R 33/093 |
| | | 365/158 |

(Continued)

OTHER PUBLICATIONS

Preliminary French Search Report issued Apr. 13, 2022 in French Application 21 08809 filed on Aug. 20, 2021, 4 pages (with English Translation of Categories of Cited Documents).
(Continued)

*Primary Examiner* — Michael T Tran
(74) *Attorney, Agent, or Firm* — Oblon, McClelland, Maier & Neustadt, L.L.P.

(57) ABSTRACT

A neuromorphic circuit suitable for implementing a neural network includes word lines, pairs of complementary bit-lines, source lines, a set of elementary cells, and an electronic circuit implementing a neurone having an output. The electronic circuit includes a set of logic components, a counting unit, and a comparison unit having a comparator and a comparison voltage generator, the comparator being configured to compare the output of the counting unit with the comparison voltage generated by the comparison voltage generator in order to output a signal dependent on the comparison and corresponding to the output of the electronic circuit.

15 Claims, 38 Drawing Sheets

(51) Int. Cl.
   *G11C 13/00* (2006.01)
   *H03K 3/037* (2006.01)

(58) Field of Classification Search
   USPC ............................................. 365/52, 230.06
   See application file for complete search history.

(56) References Cited

U.S. PATENT DOCUMENTS

| | | | | |
|---|---|---|---|---|
| 2003/0214836 | A1* | 11/2003 | Oh ...................... | G11C 11/1659 365/158 |
| 2018/0018559 | A1* | 1/2018 | Yakopcic ............. | G06N 3/0464 |
| 2020/0234114 | A1* | 7/2020 | Rakshit ................ | G06N 3/0495 |
| 2020/0311533 | A1 | 10/2020 | Agrawal et al. | |
| 2020/0356847 | A1* | 11/2020 | Yi ........................... | G06F 17/15 |
| 2021/0125045 | A1* | 4/2021 | Jang ........................ | H01L 25/18 |
| 2021/0125048 | A1* | 4/2021 | Jang .................. | G11C 13/0007 |
| 2021/0166108 | A1 | 6/2021 | Lee et al. | |
| 2021/0190913 | A1* | 6/2021 | Vasanthakumaribabu .................. | G06N 3/049 |
| 2021/0319293 | A1* | 10/2021 | Lee ........................ | G06N 3/065 |
| 2022/0036164 | A1* | 2/2022 | Kale ................... | G11C 13/004 |
| 2022/0270683 | A1* | 8/2022 | Nakao ................ | G11C 13/0038 |
| 2022/0293157 | A1* | 9/2022 | Park ................... | G11C 11/2259 |

OTHER PUBLICATIONS

Hirtzlin et al., "Digital Biologically Plausible Implementation of Binarized Neural Networks with Differential Hafnium Oxide Resistive Memory Arrays", arxiv.org, 2019, 21 pages.

Wang et al., "Efficient and Robust Nonvolatile Computing-In-Memory Based on Voltage Division in 2T2R RRAM With Input-Dependent Sensing Control", IEEE Transactions on Circuits and Systems—II: Express Briefs, vol. 68, No. 5, May 2021, 5 pages.

Valavi et al., "A Mixed-Signal Binarized Convolutional-Neural-Network Accelerator Integrating Dense Weight Storage and Multiplication for Reduced Data Movement", 2018 IEEE Symposium on VLSI Circuits, 2018, 2 pages.

Bankman et al., "An Always-On 3.8 μJ/86% CIFAR-10 Mixed-Signal Binary CNN Processor with All Memory on Chip in 28nm CMOS", 2018 IEEE International Solid-State Circuits Conference, 2018, 3 pages.

* cited by examiner

Figure 6:
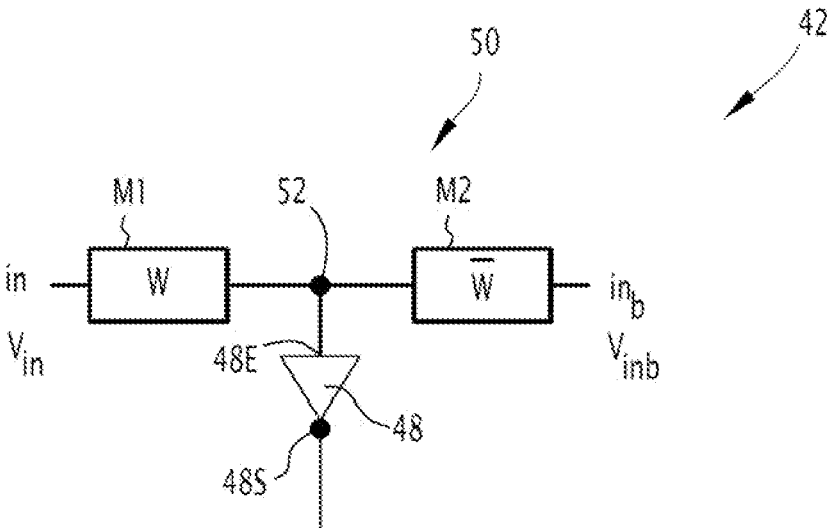

<u>FIG.6</u>

$$XMOR:$$

| $IA_{x,y,z}$ | $W^n_{i,j,k}$ | $O^n_{i,j,k}$ |
|---|---|---|
| GND | GND | VDD |
| GND | VDD | GND |
| VDD | GND | GND |
| VDD | VDD | VDD |

NEUROMORPHIC CIRCUIT BASED ON 2T2R RRAM CELLS

The present invention relates to a neuromorphic circuit suitable for implementing a neural network.

For multiple applications, including automatic data processing, diagnostic assistance, predictive analysis, autonomous vehicles, bioinformatics or monitoring, it is known how to use machine learning algorithms which are part of programs which can be run on processors such as CPUs or GPUs. A CPU is a processor, the acronym CPU coming from "Central Processing Unit" literally meaning central processing unit while a GPU is a graphics processor, the acronym GPU coming from "Graphics Processing Unit" literally meaning graphics processing unit.

Among the techniques for implementing learning, the use of neural networks is becoming more and more widespread, such structures being considered very promising due to their performance for many tasks such as automatic data classification, pattern recognition, automatic language translation and understanding, robotic control, automatic navigation, recommendation systems, anomaly detection, fraud detection, DNA testing or the discovery of new molecules.

A neural network generally consists of a succession of layers of neurones, where each layer takes the inputs thereof from the outputs of the preceding layer. More precisely, each layer comprises neurones the inputs thereof from the outputs of the neurones of the preceding layer. Each layer is connected by a plurality of synapses. A synaptic weight is associated with each synapse. The synaptic weight is a real number, which takes positive and negative values. For each layer, the input of a neurone is the weighted sum of the outputs of the neurones of the previous layer, the weighting being done by synaptic weights.

For an implementation in a CPU or a GPU, problems relating to "Von Neumann bottleneck" arise because the implementation of a deep neural network (with more than three layers and up to several tens of layers) involves using both the memory or the memories and the processor while the latter elements are spatially separated. A jamming of the communication bus results from there, between the memory or the memories and the processor, both while the trained neural network is being used for performing a task, and even more so, while the trained neural network is being trained, i.e. while the synaptic weights thereof are set for solving the task in question with maximum performance.

It is therefore desirable to develop dedicated hardware architectures, intermixing memory and computation, so as to produce fast neural networks, with low power consumption and apt to learn in real time.

A neural network based on optical technologies is known.

Another field of research focuses on producing neurones and synapses of neural networks based on CMOS technology. "CMOS" is the acronym for "Complementary Metal-Oxide-Semiconductor"). CMOS refers both to a manufacturing process and to a component obtained by such a manufacturing process.

However, according to each of the technologies, each neurone occupies several tens of micrometers on the side thereof. Moreover, each synapse also occupies several tens of micrometers on the side thereof. As a result, on a limited surface corresponding e.g. to an electronic chip, the number of neurones and synapses which can be integrated is limited, which results in a reduction in the performance of the neural network.

Therefore, to reduce congestion, architectures with memristive synapses are specifically studied.

Memristive synapses are synapses using memristors. In electronics, a memristor is a passive electronic component. The name is a blend formed from the two words, memory and resistor. A memristor is a non-volatile memory component, the value of the electrical resistance thereof changing with the application of a voltage for a certain period of time and remaining at that value in the absence of voltage.

An example of such an implementation is proposed in an article by L. Wang et al. entitled "*Efficient and Robust Nonvolatile Computing-In-Memory based on Voltage Division 2T2R RRAM with Input-Dependent Sensing Control*" published on 19 Mar. 2021 in the review *Transactions on Circuits and Systems II: Express Briefs*. The neural network is formed by a set of memory cells connected to a specific readout circuit.

It should be noted that such implementation relates to a particular neural network which is a binary neural network, i.e. a network in which neurones and synapses can only take binary values. Such neural networks have the advantage of making simpler computations possible, and yet still have good performance during inference, in particular for monitoring-related applications.

However, the implementation proposed by the article by L. Wang et al. is relatively bulky and difficult to integrate into a memory cell structure.

There is therefore a need for a neuromorphic circuit making it possible to produce a binary neural network which is less bulky and having better integrability into a set of memory cells.

To this end, the description describes a neuromorphic circuit suitable for implementing a neural network, the neuromorphic circuit comprising:

word lines, pairs of complementary bit-lines, source lines, a set of elementary cells organized according to a two-dimensional matrix including rows and columns, the set of elementary cells including a storage assembly grouping together a set of lines of elementary cells, the elementary cells of the storage assembly being memory cells, where the memory cells of the same line can be selected by a word line, the memory cells of the same column being connected to a pair of complementary bit-lines and a source line, each memory cell comprising two memristors and two switches, each memristor being connected to the same source line and to a corresponding switch, each memristor storing a weight or the inverse of the same weight, respectively, and having different first and second resistance values respectively, the switches being connected, for the activation thereof, to a word line and correspondingly connected to a pair of complementary bit-lines, an electronic circuit implementing a neurone having an output and including:

a set of logic components, each logic component having a logic unit comprising an input connected to a corresponding source line, the logic unit being apt to perform a logic operation which involves switching between a low value and a high value depending on the value of the input or inputs of the logic unit, each logic unit performing a logic function such as an inverter or double inverter, a counting unit, the counting unit being apt to count the number of high or low values at the output of the logic components, the counting unit being a bridge, where a bridge is a set of the same elements in parallel and connected together at one of the terminals thereof to an output of the counting unit, each element being connected to a corresponding logic component and being a resistor or a capacitor, a comparison unit comprising a comparator and a comparison voltage generator, the comparator being suitable for comparing the output of the counting unit with the comparison voltage generated by the comparison voltage generator in order to output a signal dependent on the comparison and corresponding to the output of the electronic circuit which implements a neurone.

According to particular embodiments, the neuromorphic circuit has one or more of the following features, taken alone or in all technically possible combinations:

each memristor includes a virgin state, the counting unit being a row of elementary cells, each elementary cell of the counting unit being a cell comprising two memristors in the virgin state and two switches, each memristor in the virgin state being connected to the other memristor in the virgin state and to a corresponding switch, the switches being connected to each other;

each logic unit comprises an inverter formed from an elementary cell comprising two memristors and two switches, each memristor being connected to the other memristor and to a corresponding switch, a short-circuit path being arranged for short-circuiting the two memristors, one of the switches being connected to the ground and to the input of the logic unit for the control thereof, and the other switch being connected to a supply potential and mounted as a diode;

each logic unit comprises an inverter formed from an elementary cell comprising two memristors and two switches, each memristor being connected to the other memristor and to a corresponding switch, a first switch being connected to the ground and to the input of the logic unit for the control thereof, and the second switch being connected to a supply potential and mounted as a diode, a short-circuit path being arranged for short-circuiting the memristor connected to the first switch;

a first controller for selecting the elementary cells of a line, which are connected to the same word line, and comprising a second controller connected to the pairs of bit-lines and enabling different voltages to be applied to each pair of bit-lines and symmetrical with respect to a middle voltage, the voltage applied to a bit-line being less than or greater than that applied to the associated complementary bit-line depending on the value of an input signal, each input signal corresponding to an input of a synapse connected to said neurone;

the set formed by each logic unit is formed from at least one line of elementary cells not belonging to the storage set;

each logic unit corresponds to an inverter consisting of said switches of each elementary cell of the counting unit and of a PMOS transistor, the drain of which is connected to a supply voltage, the gate being connected to a source line SL and the source being connected to the drains of said switches;

the comparison voltage generator is a fixed voltage generator;

the comparison voltage generator is a second bridge having the same elements as the counting unit, each element of the second bridge being connected to an inverter connected to a corresponding logic unit;

the elements of the two bridges being capacitors having the same capacitance, the comparison voltage generator and the counting unit including an offset capacitor, the offset capacitor having a capacitance equal to half the capacitance of a capacitor of one of the two bridges;

the logic operation performed by each logic unit is chosen from: an XOR gate with an input set to 0, an inversion, a NAND gate with one of the two inputs set to 1, a NOR gate with one of the two inputs set to 0;

the neuromorphic circuit includes pull-down transistors, one of the pull-down transistors being connected to all the elements of the counting unit and the other pull-down transistors being connected to a corresponding source line, the pull-down transistors being suitable for erasing the elements;

the neuromorphic circuit includes a plurality of distinct sets of elementary cells apt to operate in parallel;

the source lines having a plurality of portions, where portions of the lines are specific to a set of elementary cells;

the neuromorphic circuit being a three-dimensional integrated circuit;

the neuromorphic circuit comprises bias units modifying the comparison voltage;

the neuromorphic circuit takes as input values coded on several bits, each bit taking 2 possible values, the neuromorphic circuit comprising a transfer unit followed by an accumulation unit;

the transfer unit and the accumulation unit include a switch and a capacitor;

the neuromorphic circuit comprises a comparator upstream of the two units, and the transfer unit and the accumulation unit are made according to a differential assembly.

Figure 1:
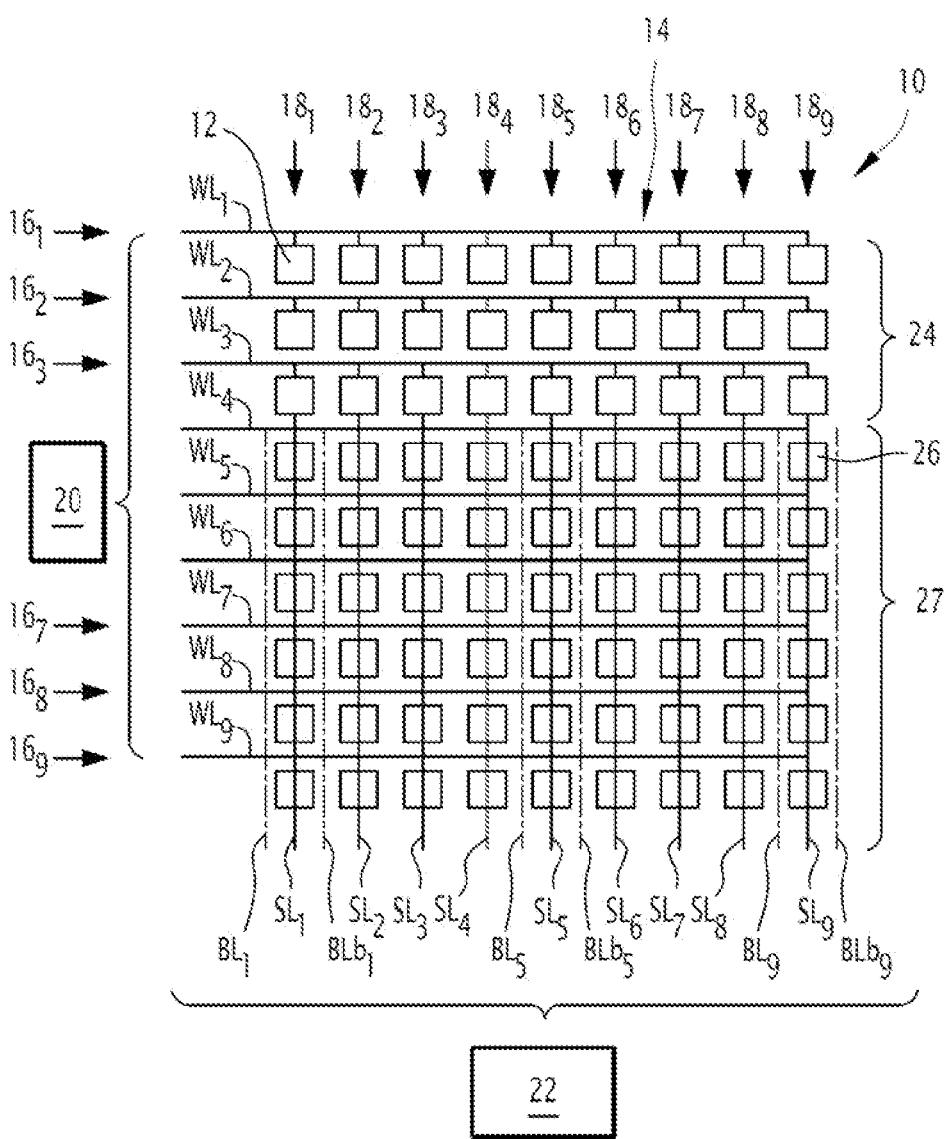
Figure 2:
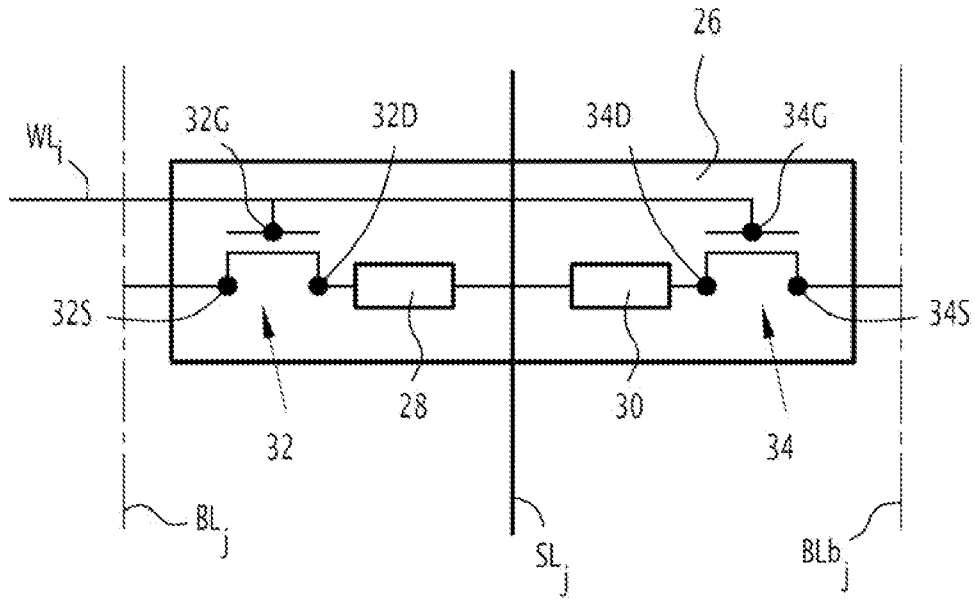
Figure 3:
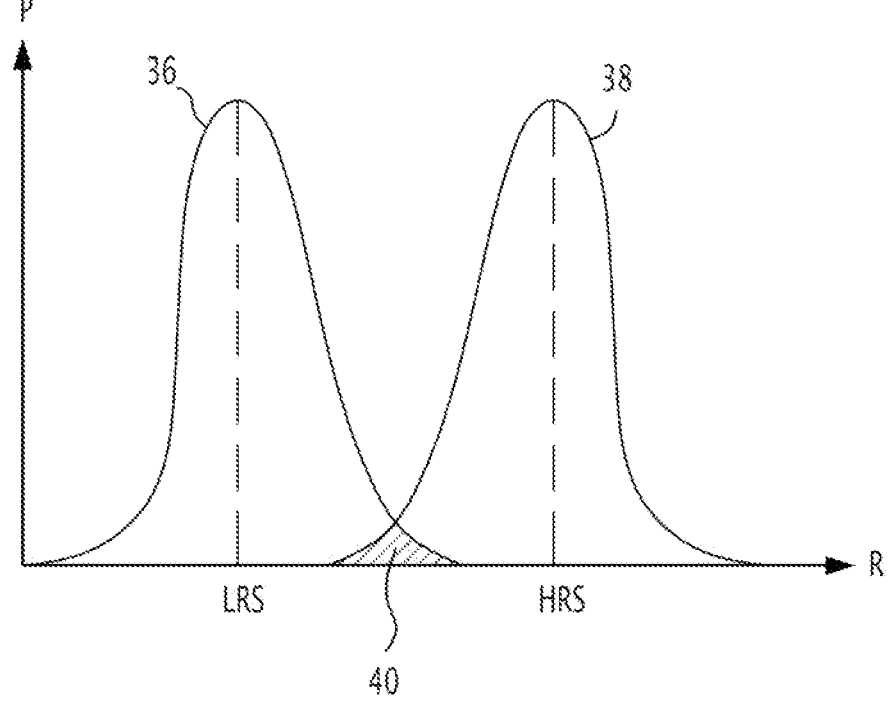
Figure 4:
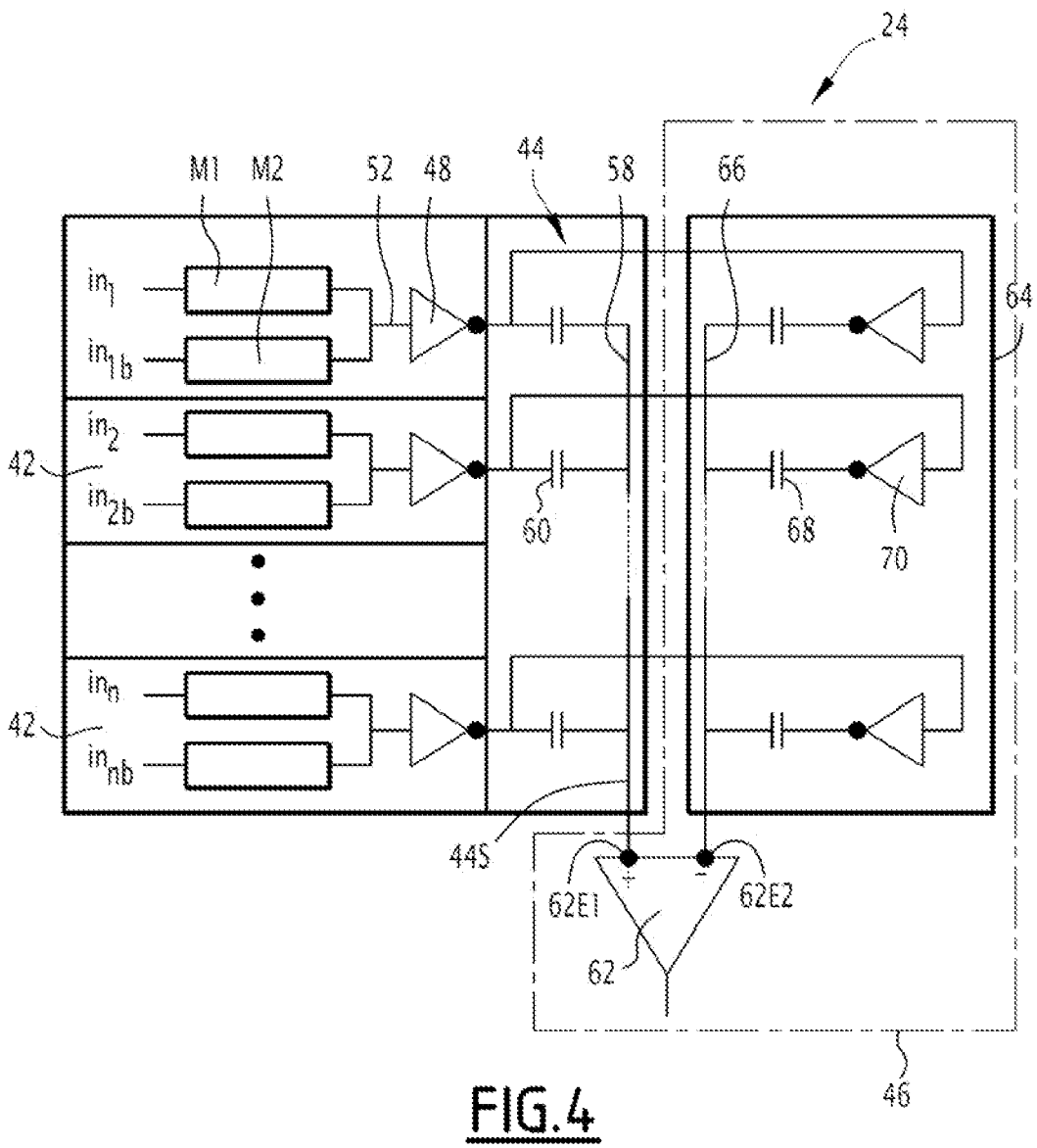
Figure 5:
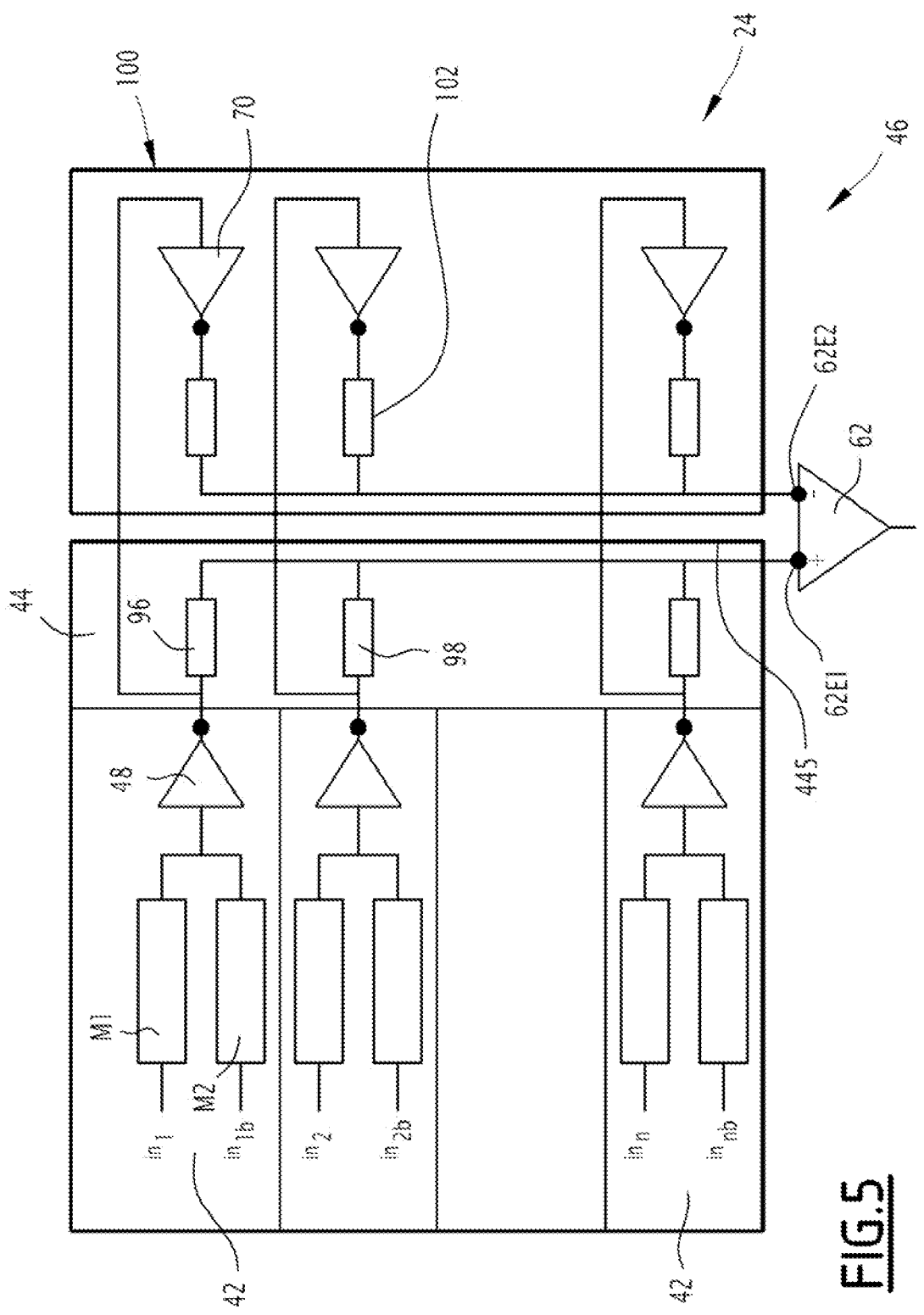
Figure 7:
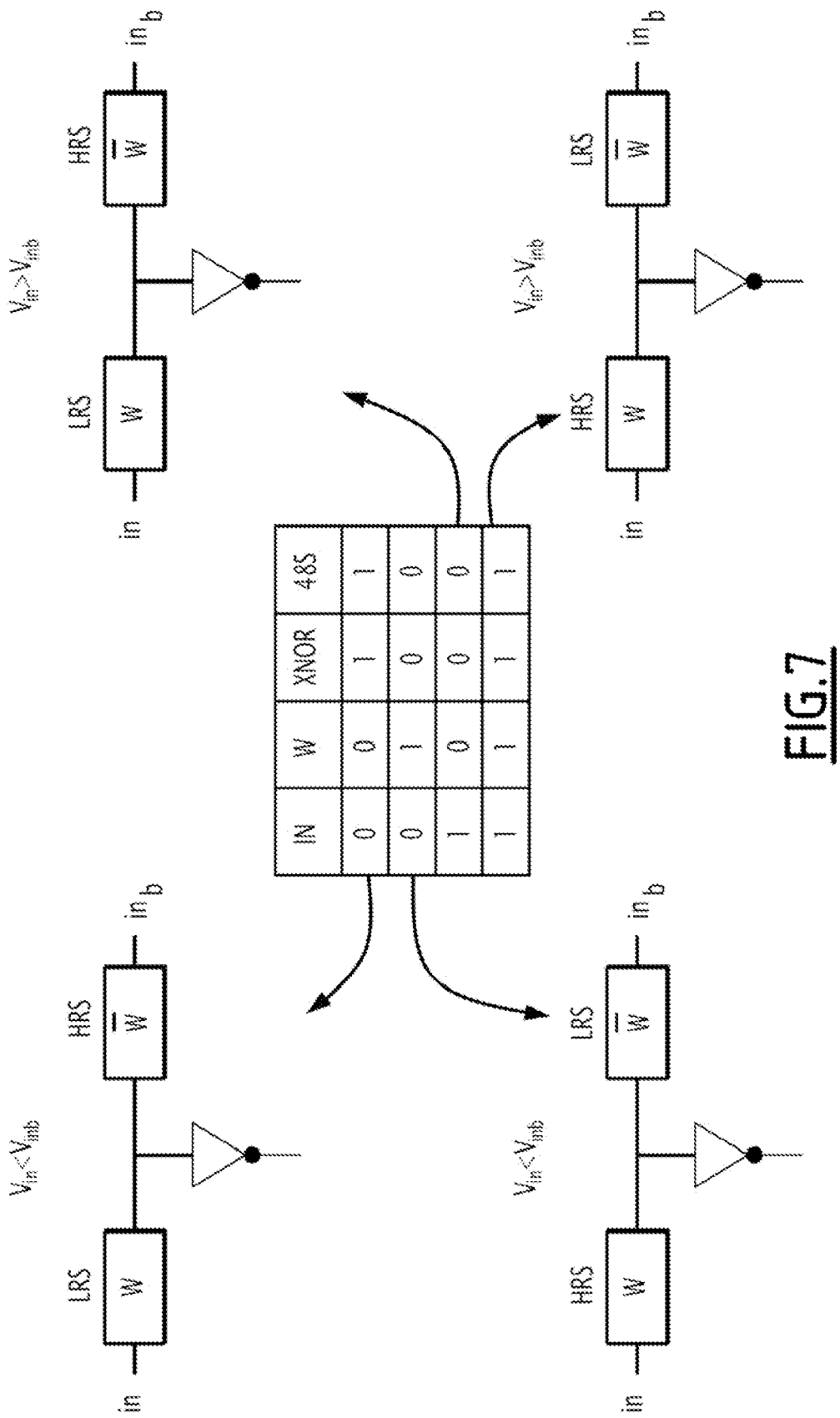
Figure 8:
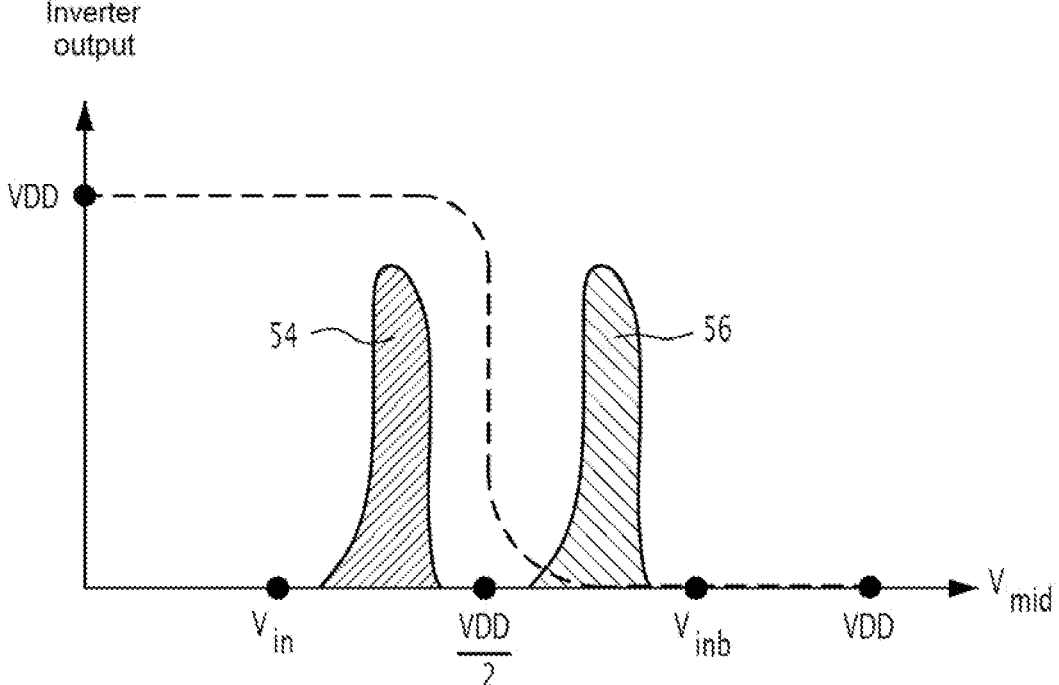
Figure 9:
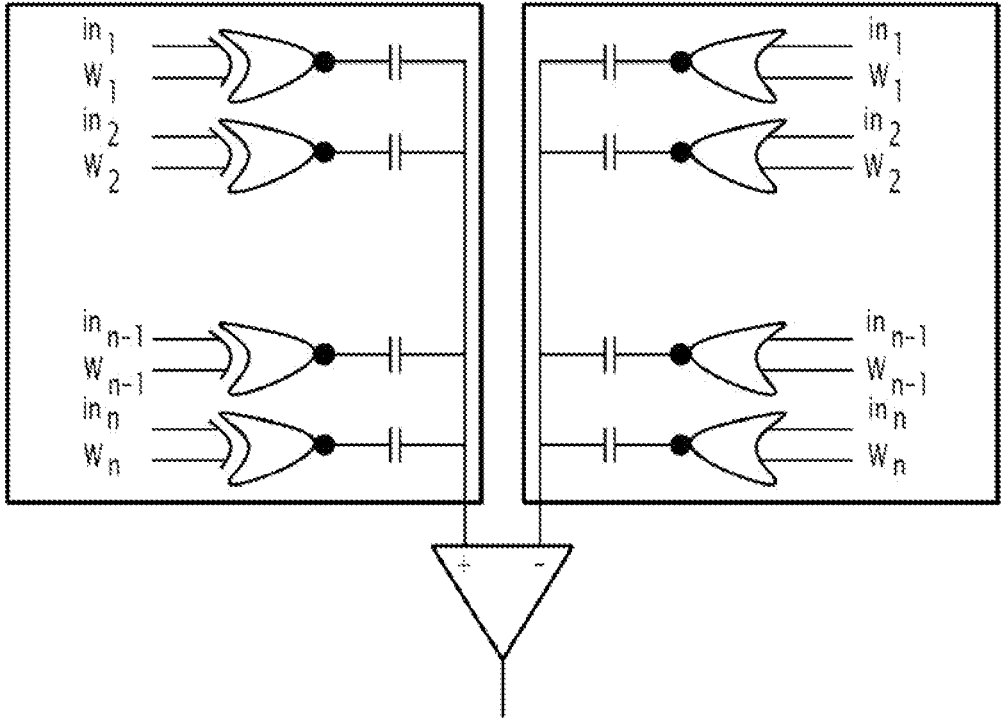
Figure 10:
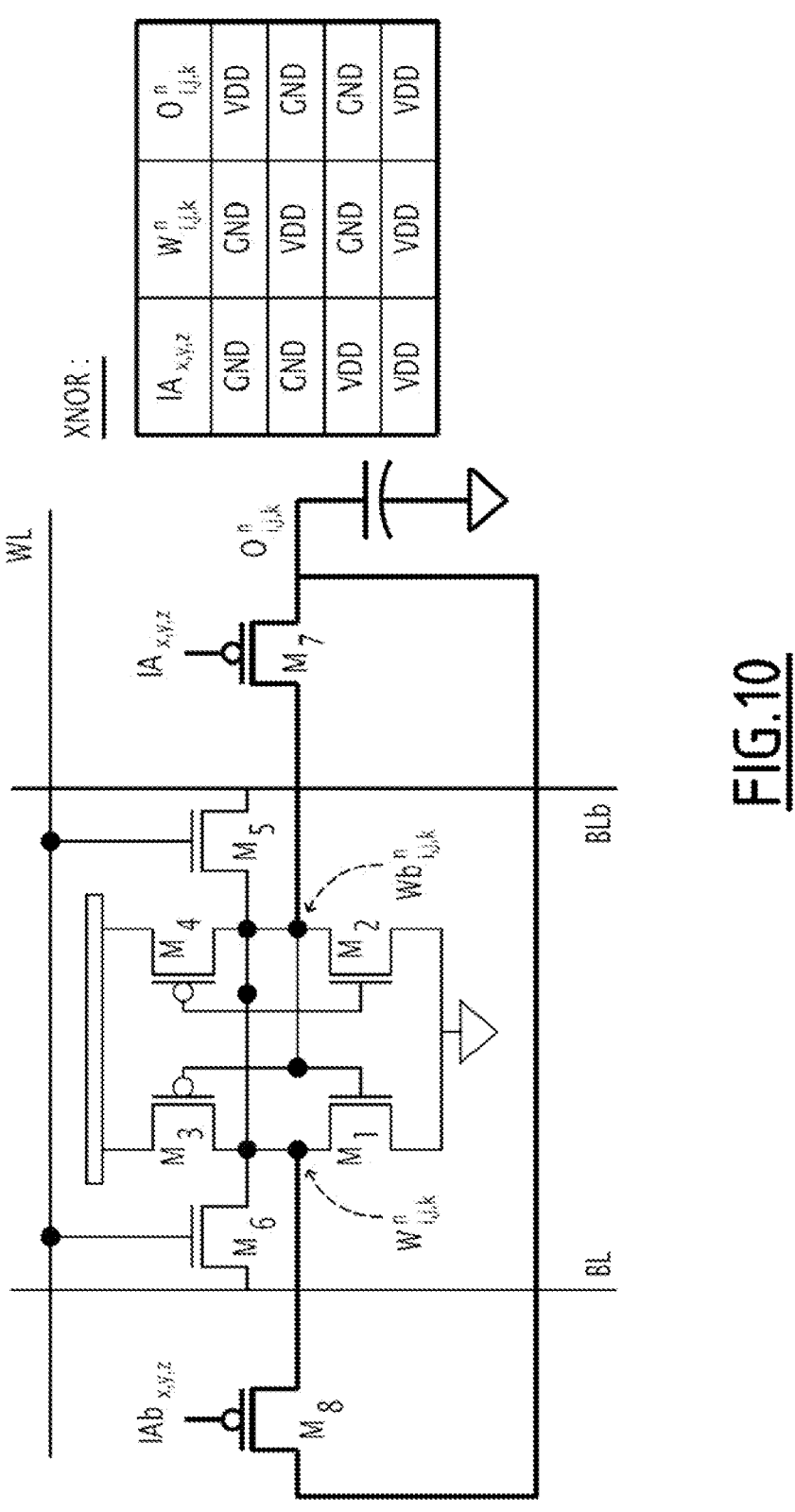
Figure 11:
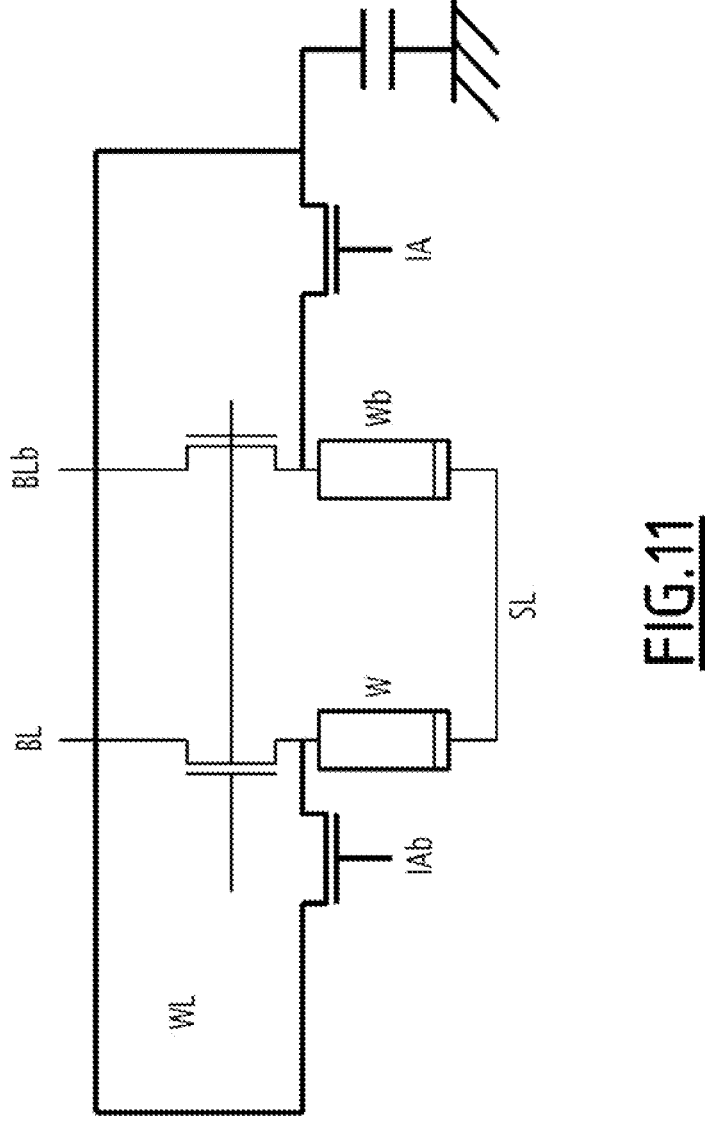
Figure 12:
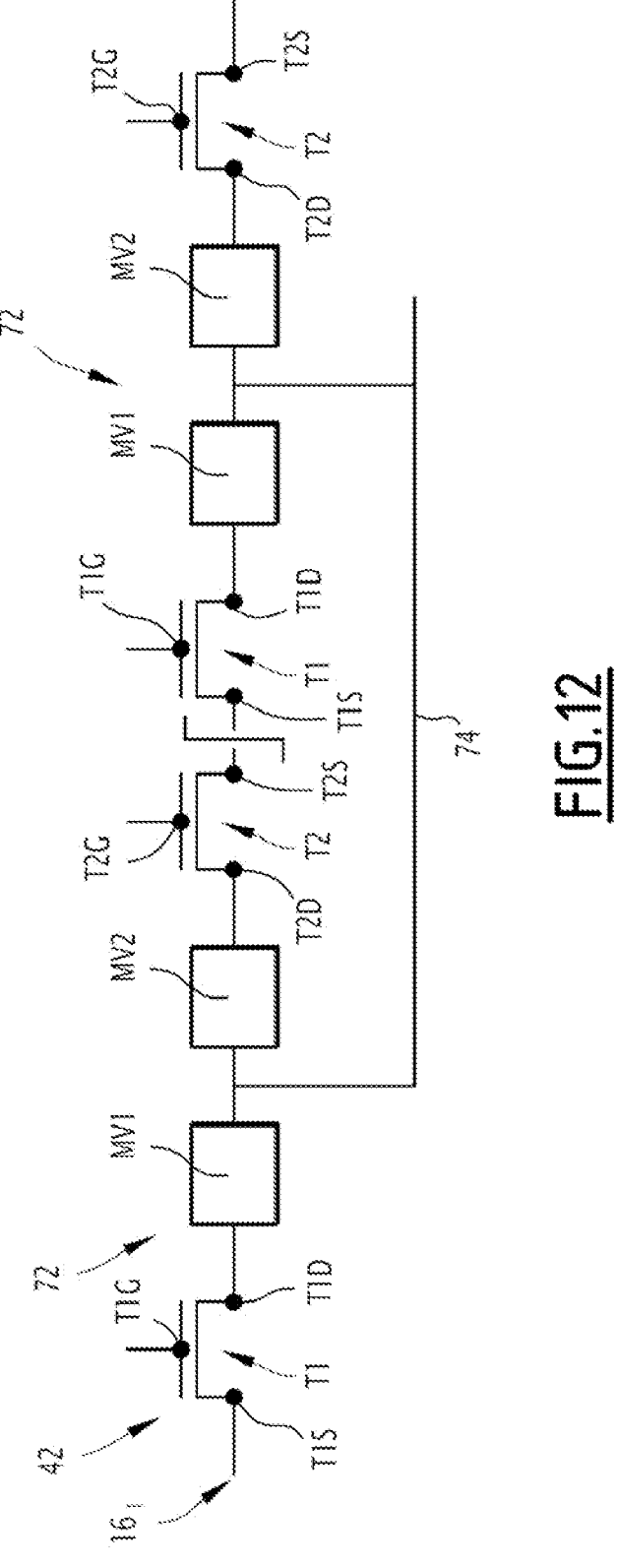
Figure 13:
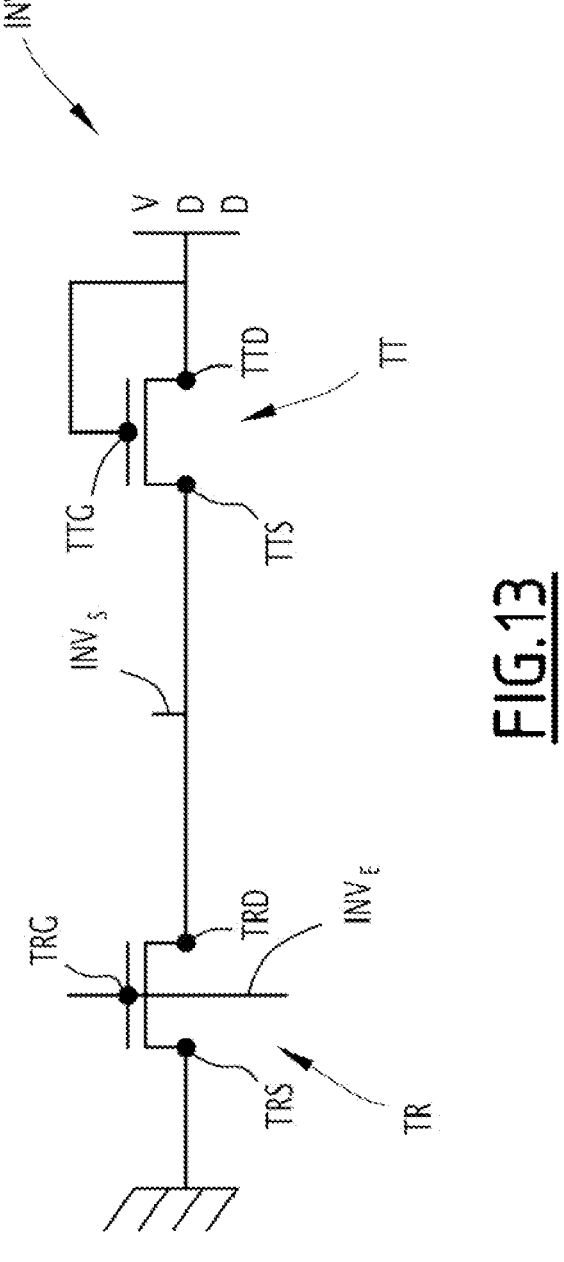
Figure 14:
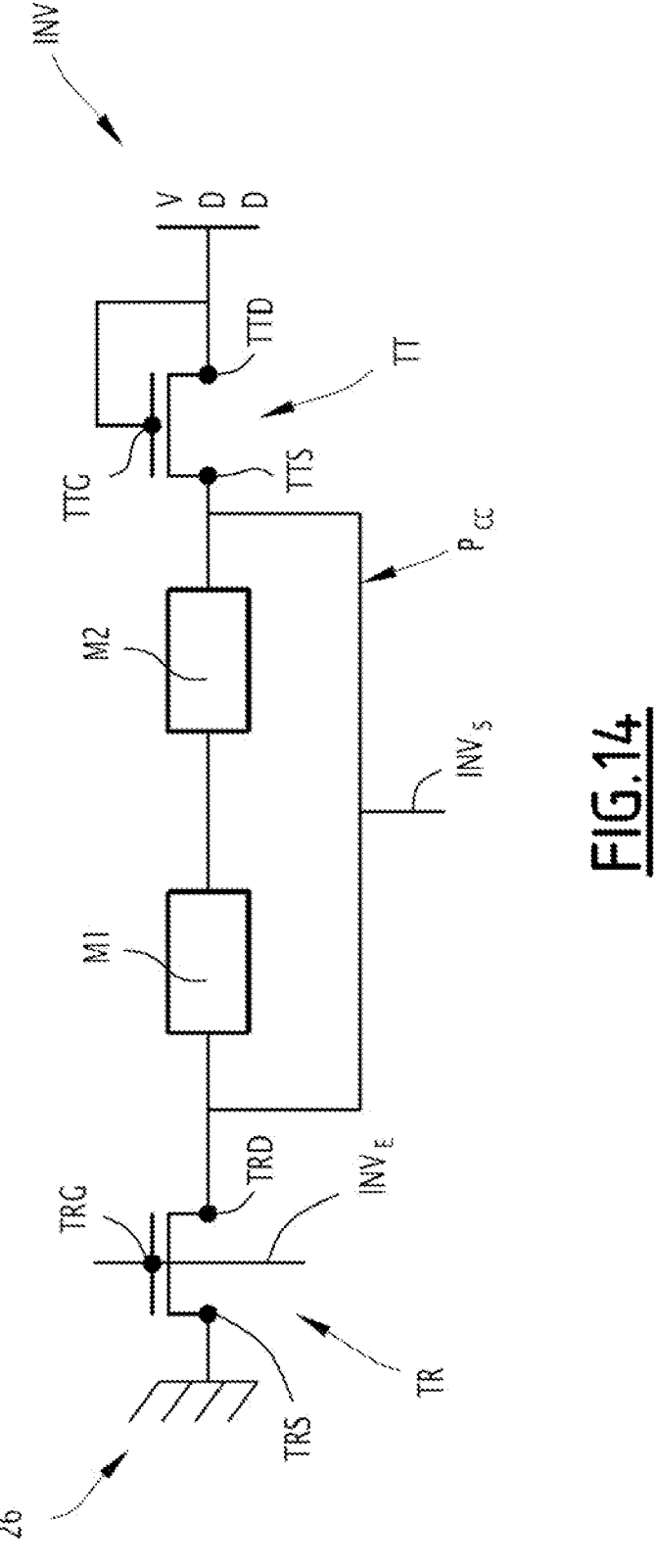
Figure 15:
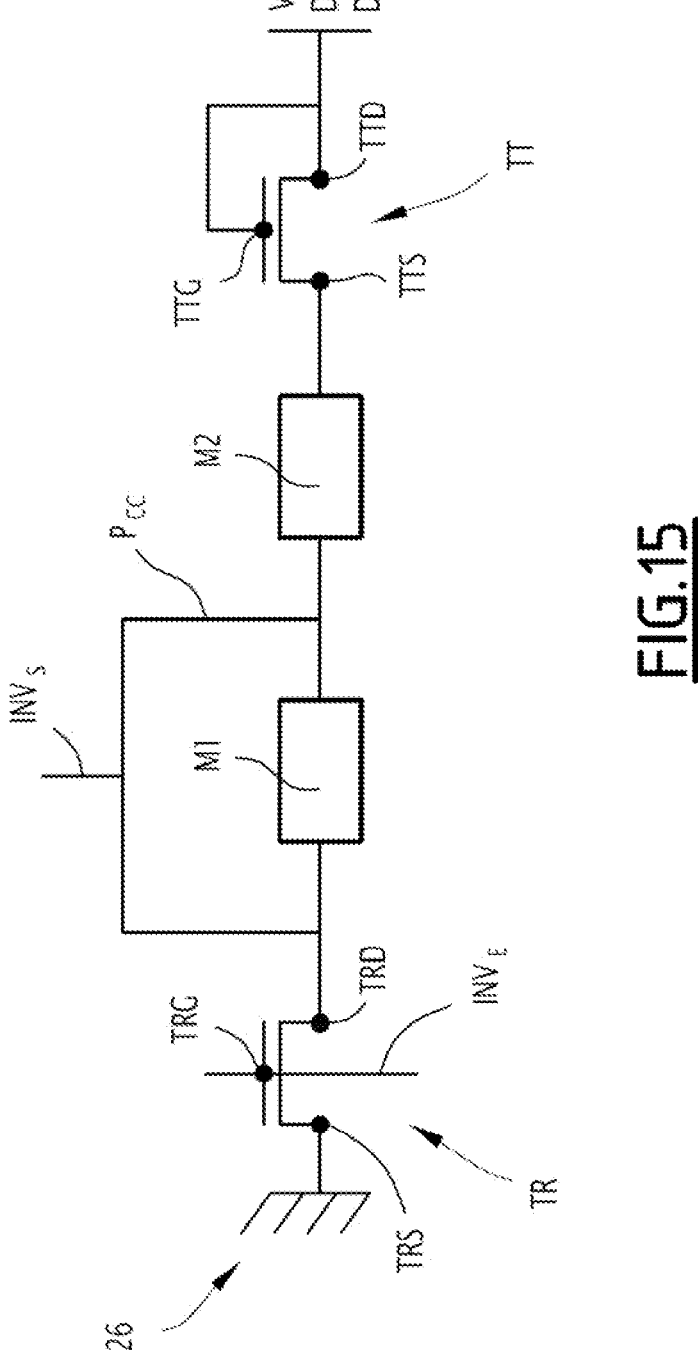
Figure 16:
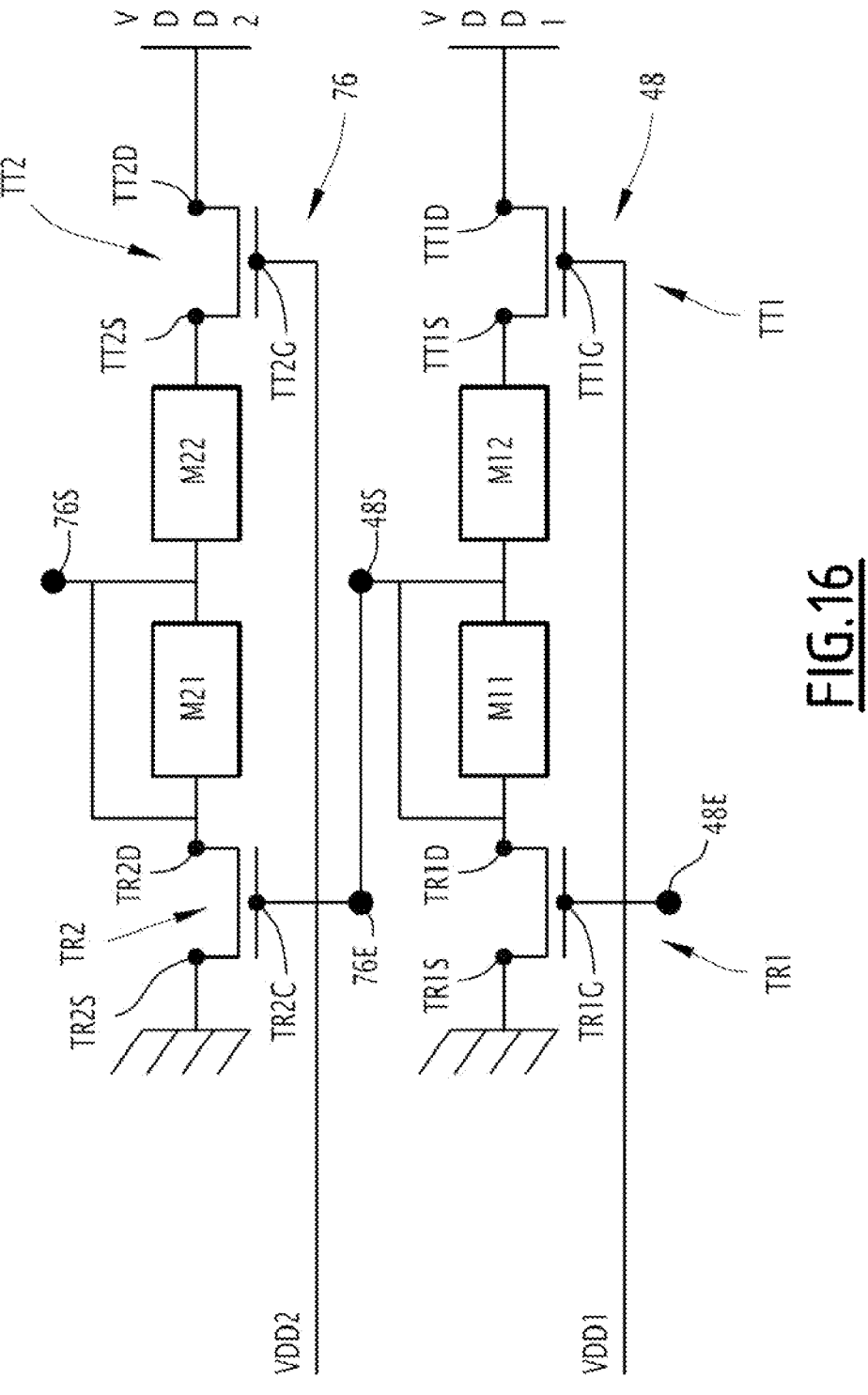
Figure 17:
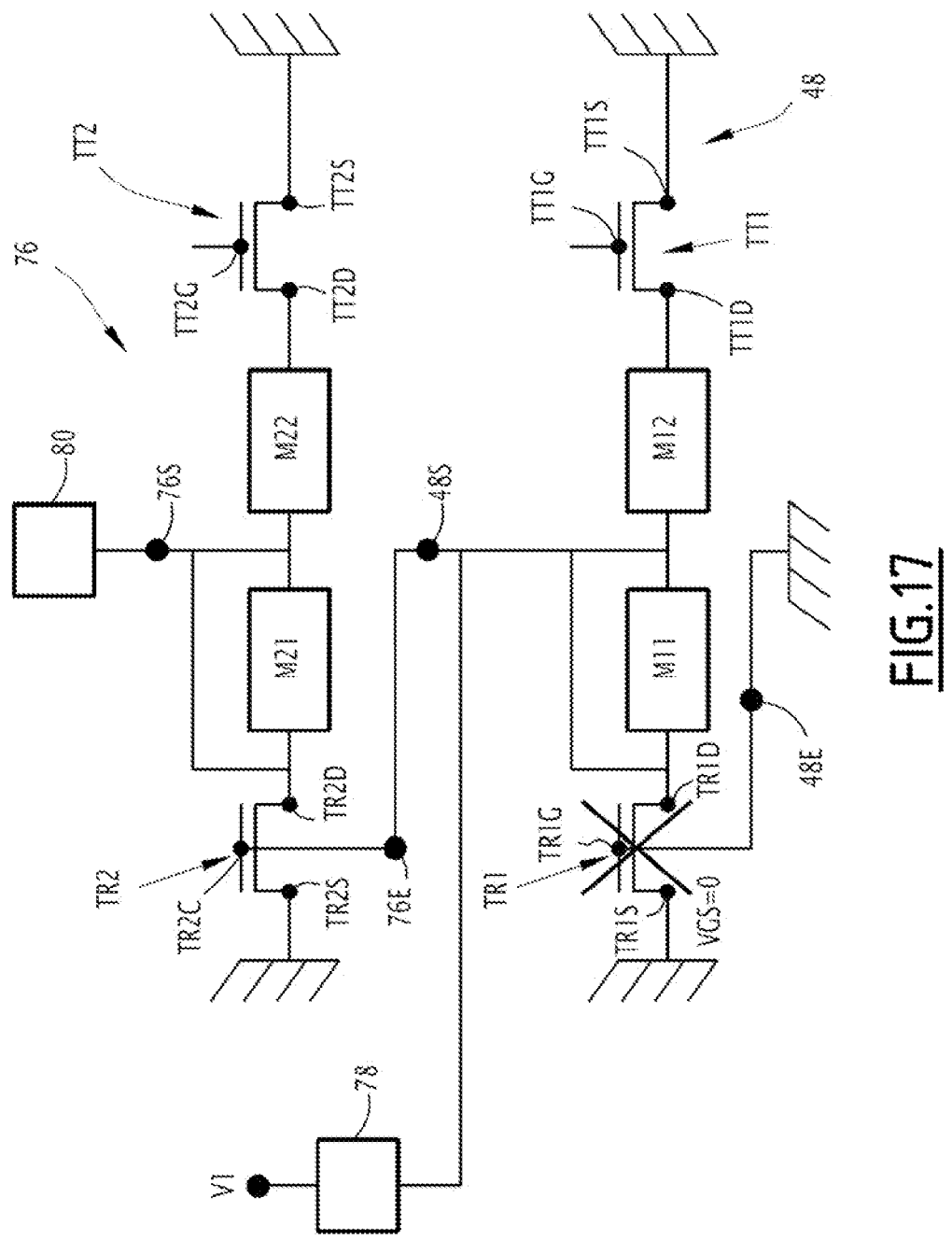
Figure 18:
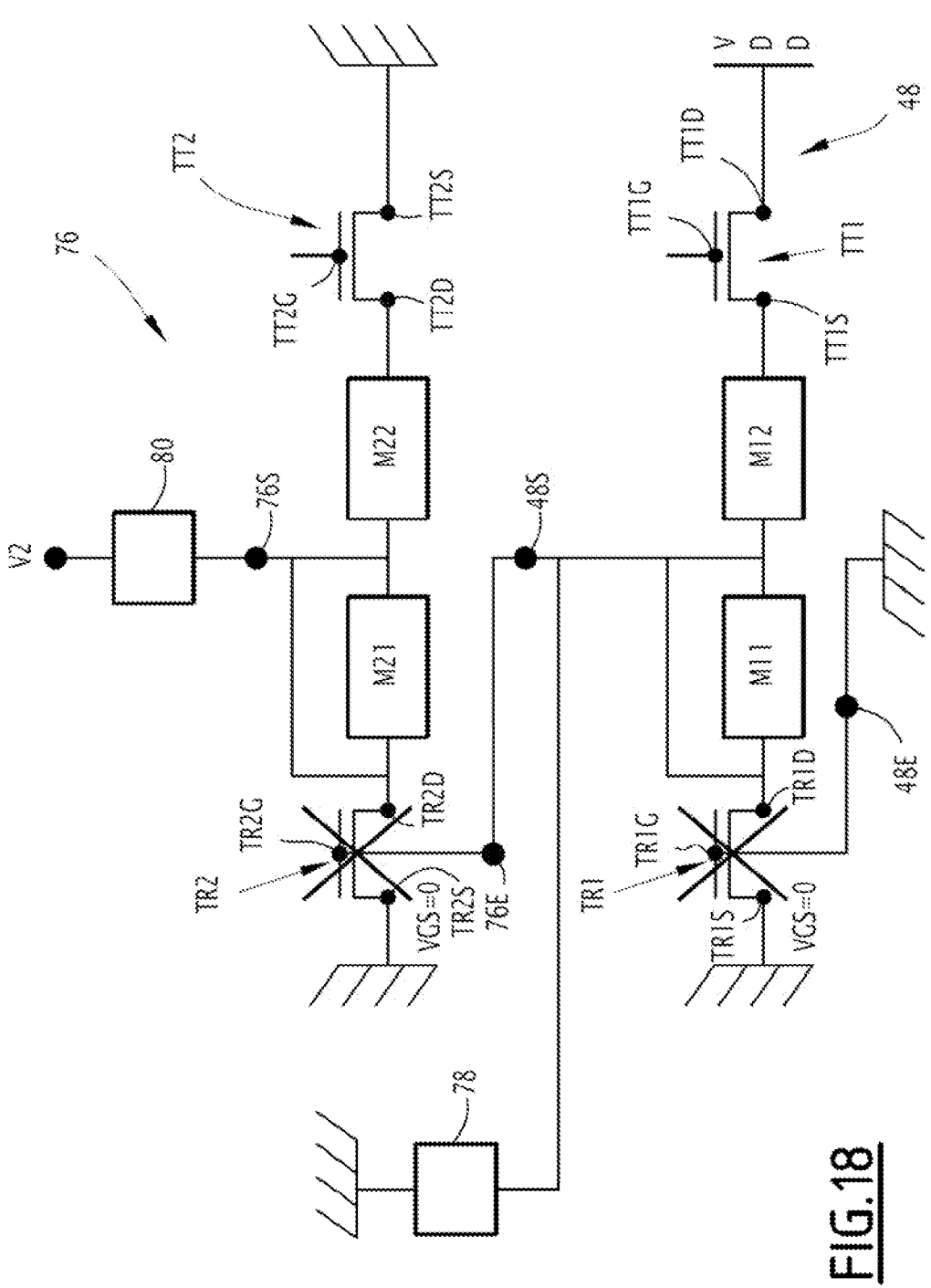
Figure 19:
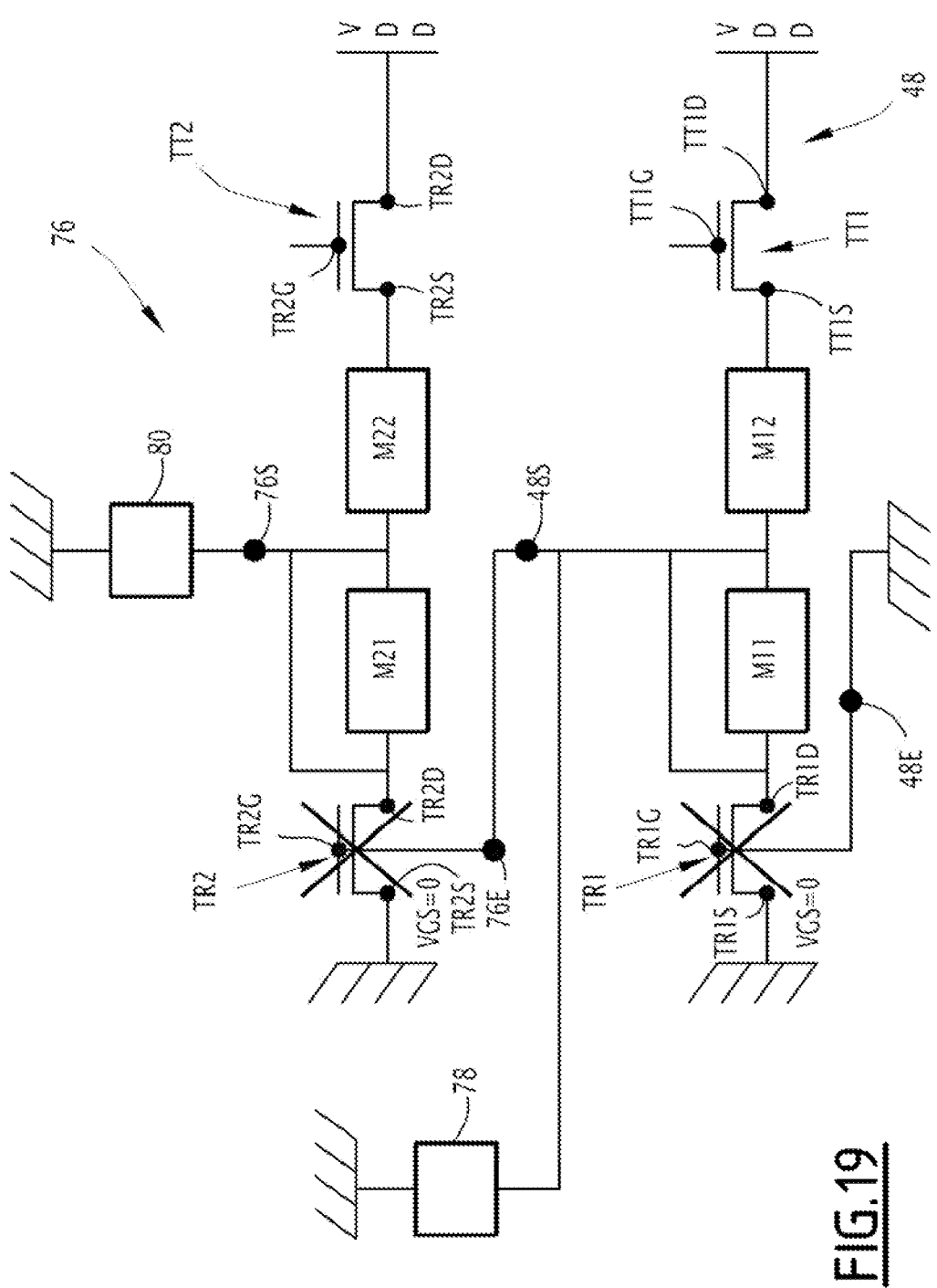
Figure 20:
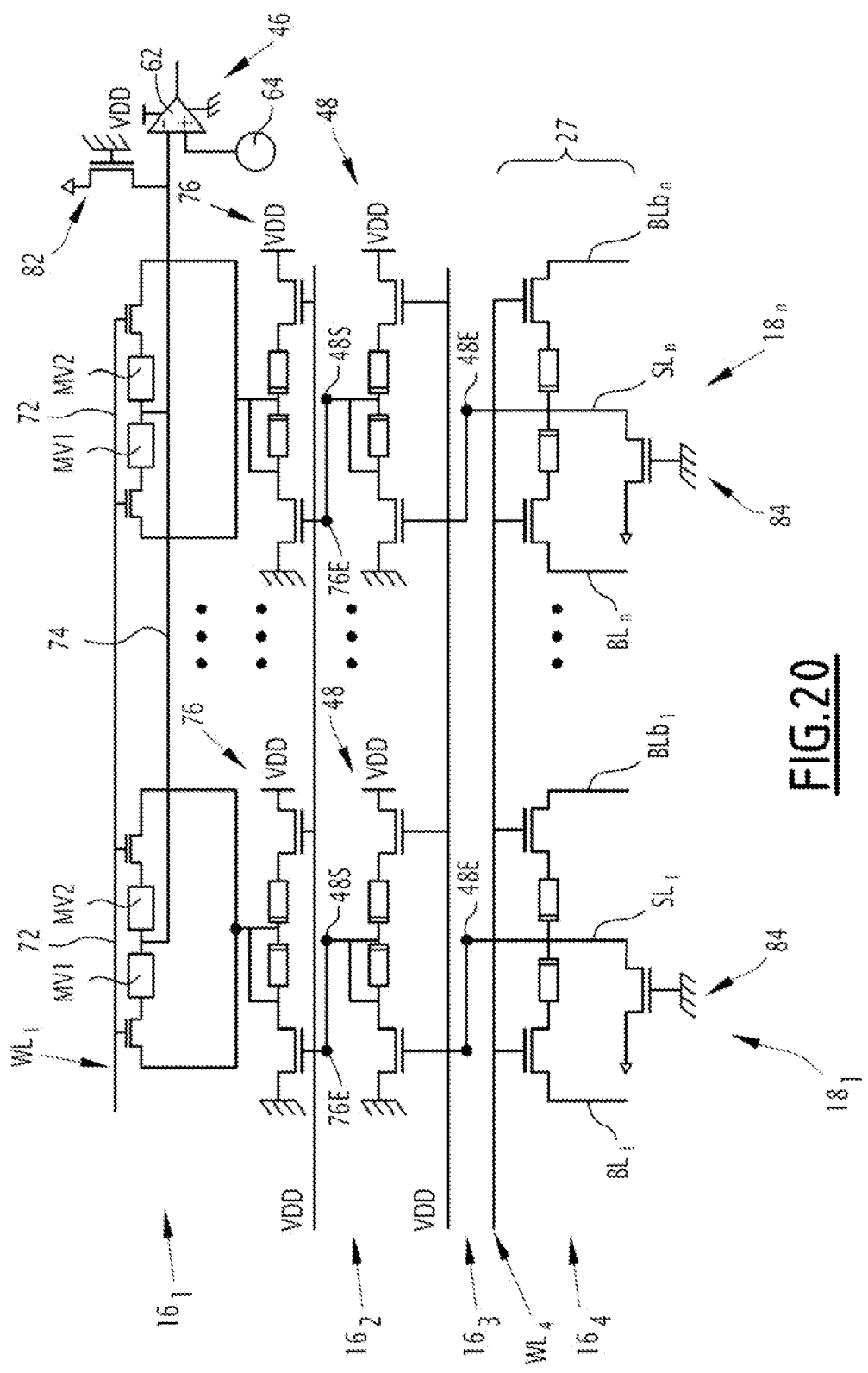
Figure 21:
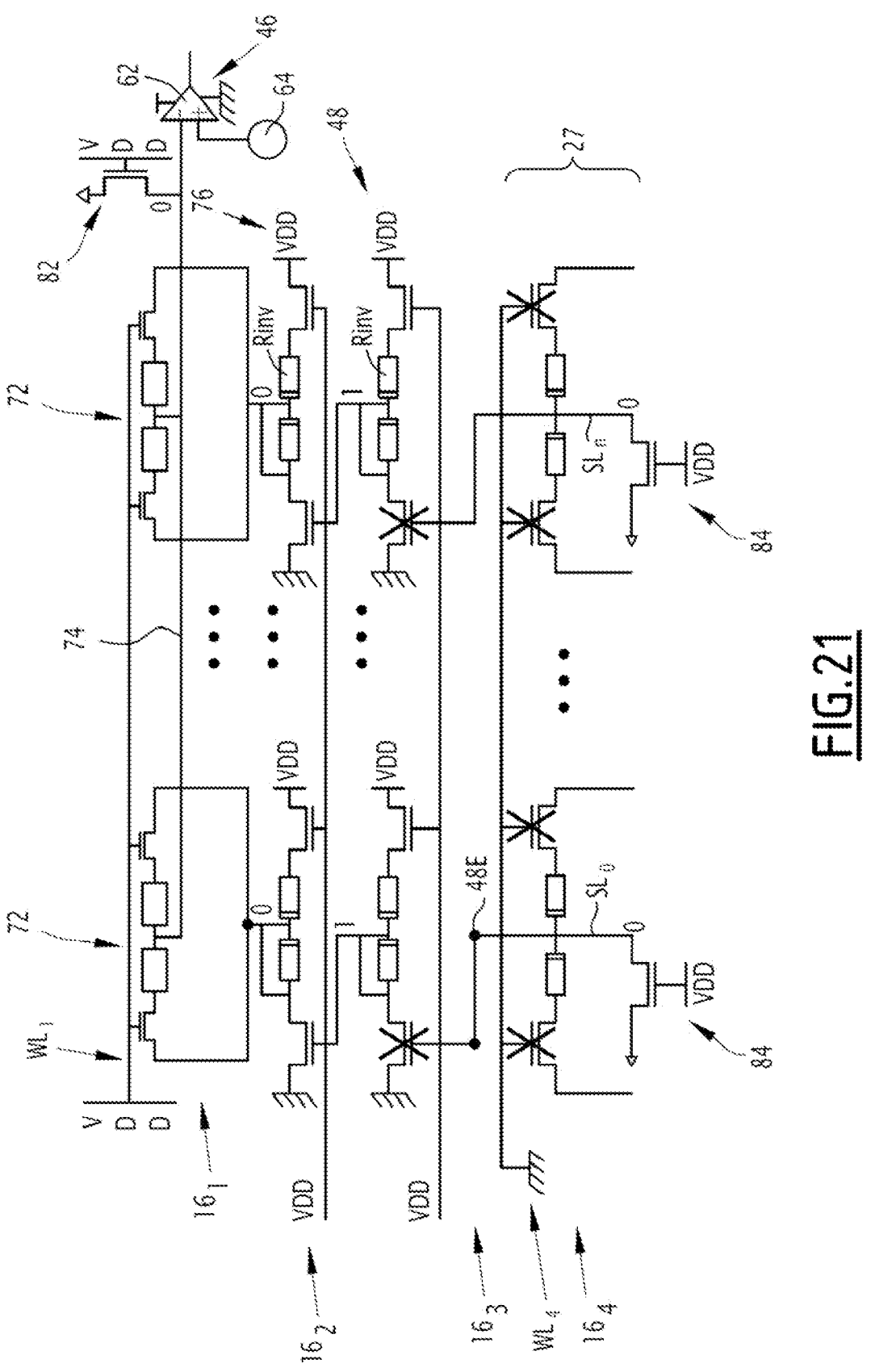
Figure 22:
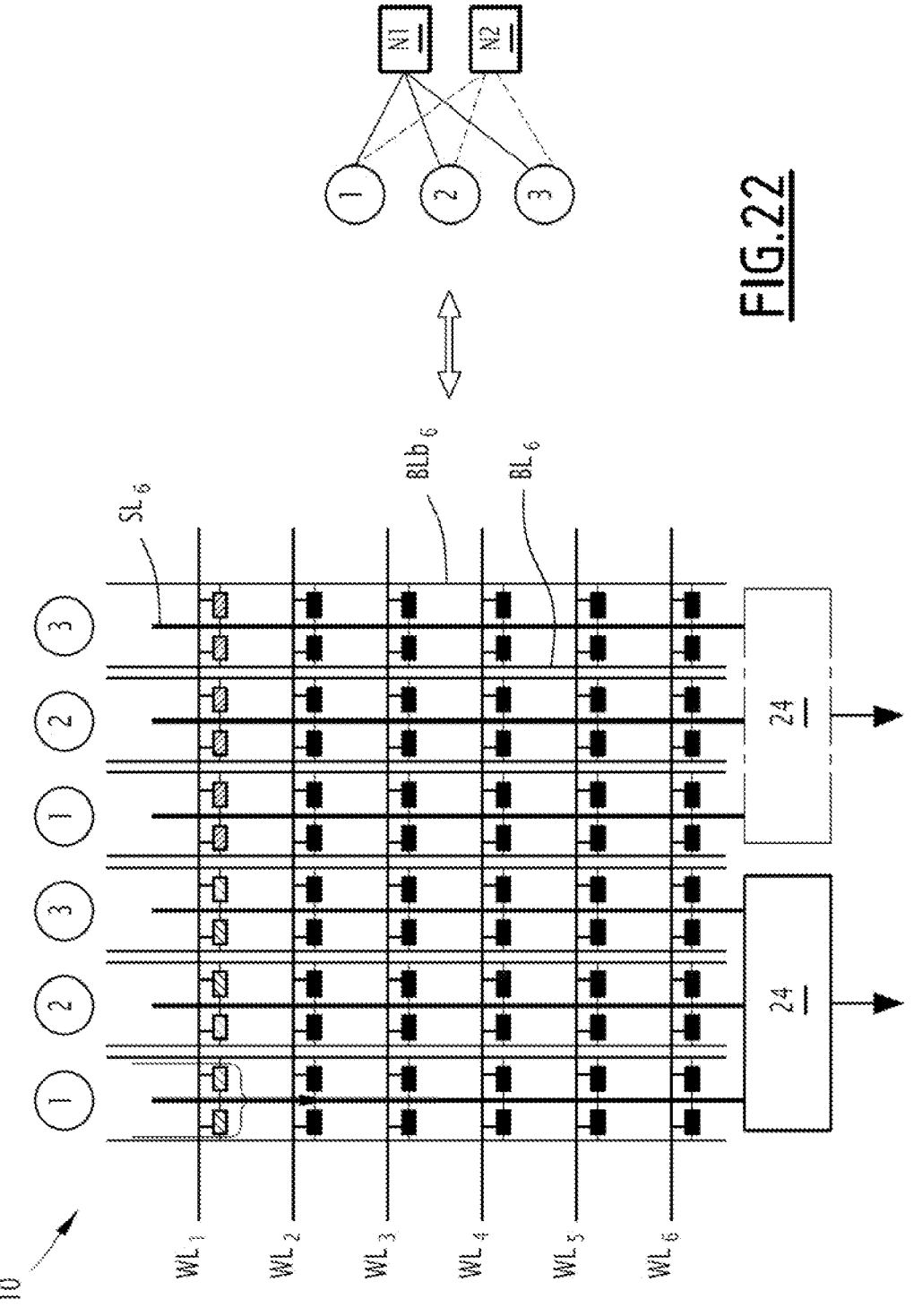
Figure 23:
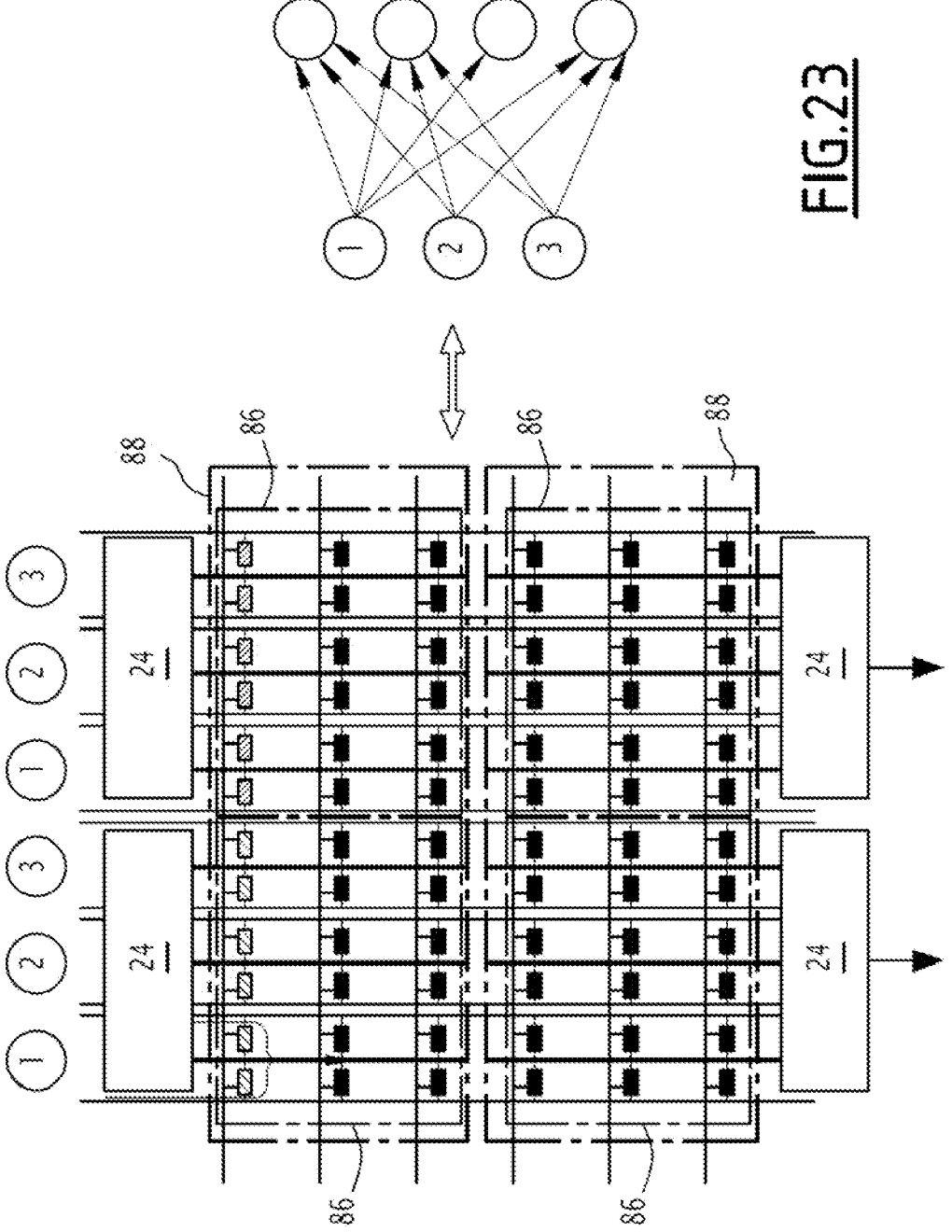
Figure 24:
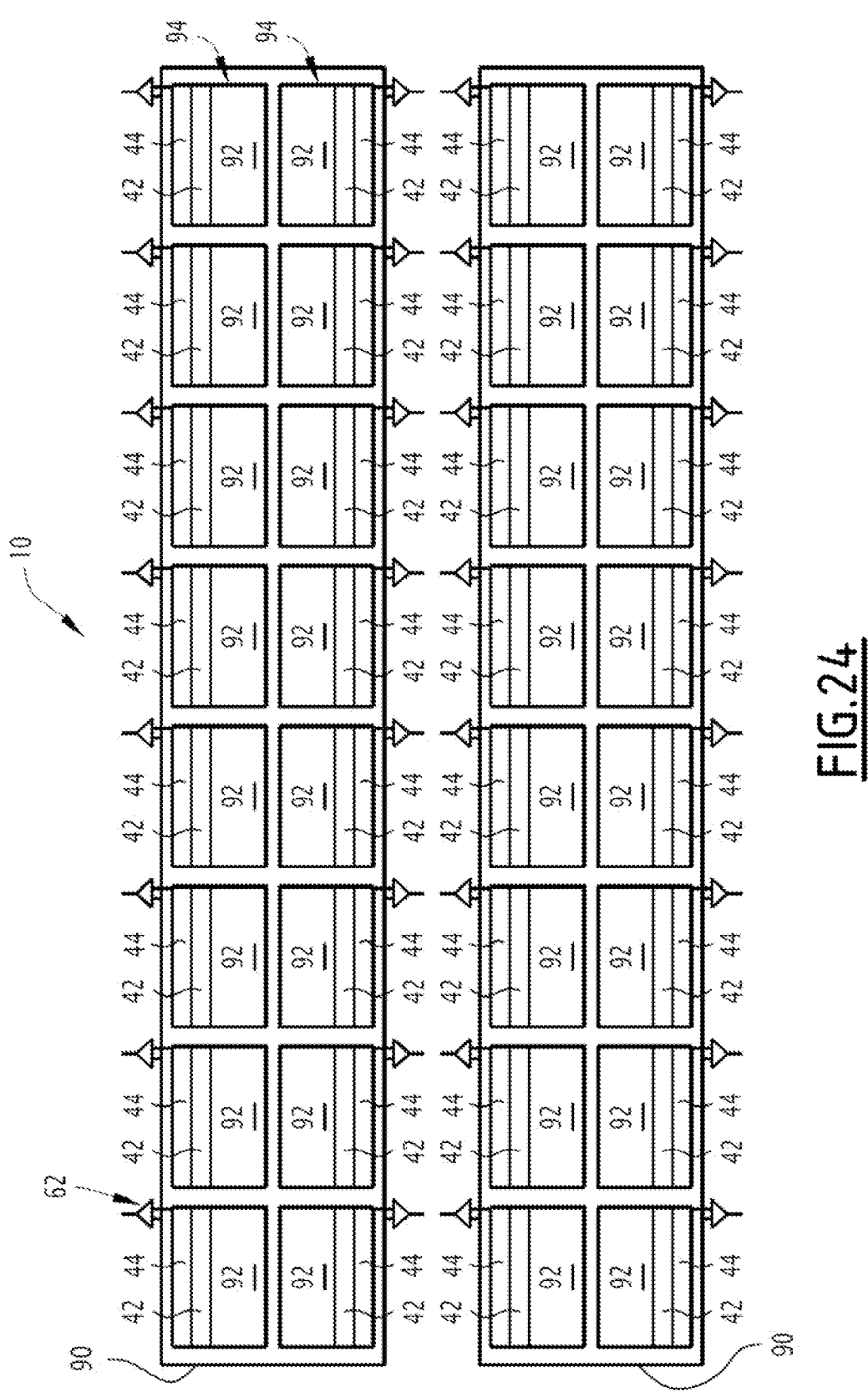
Figure 25:
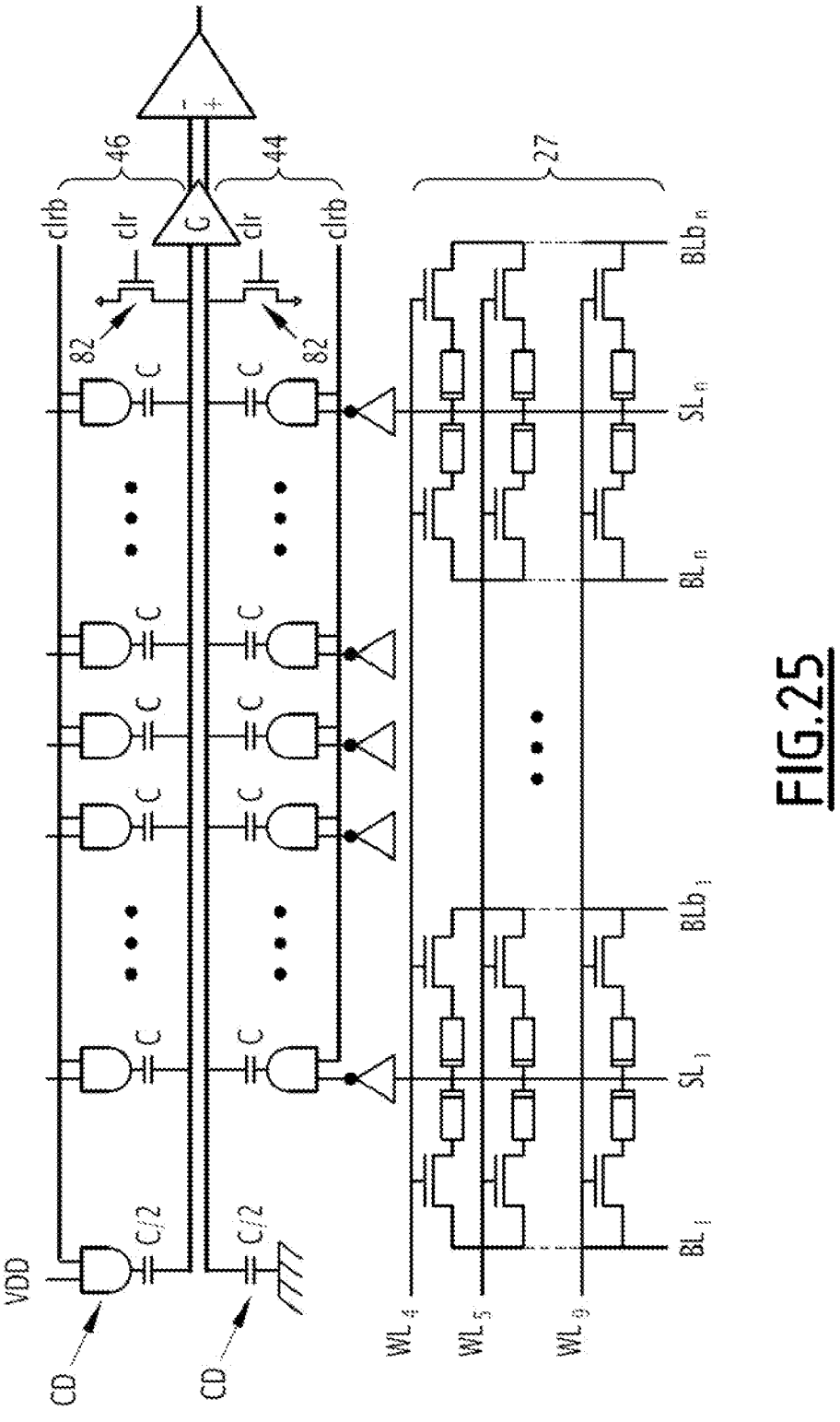
Figure 26:
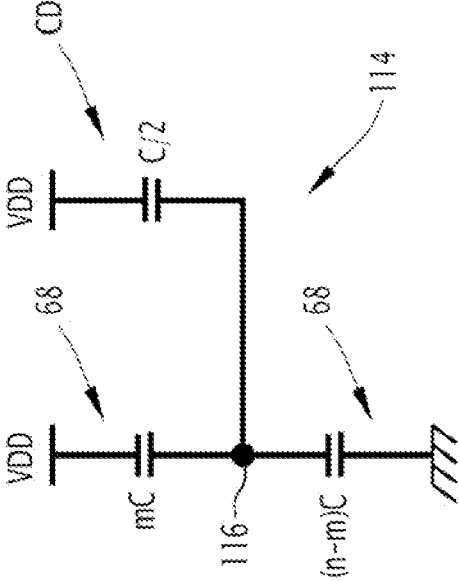
Figure 27:
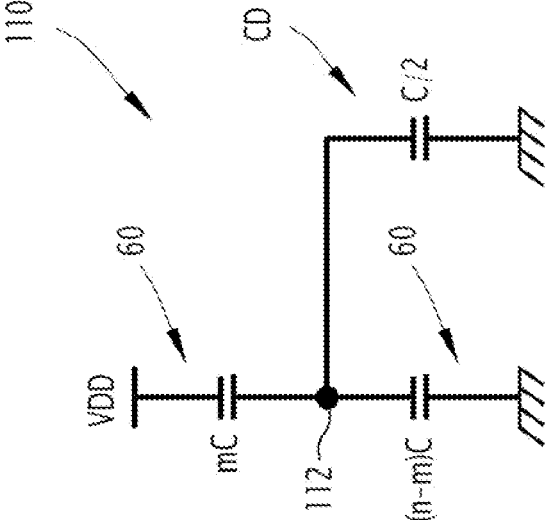
Figure 28:
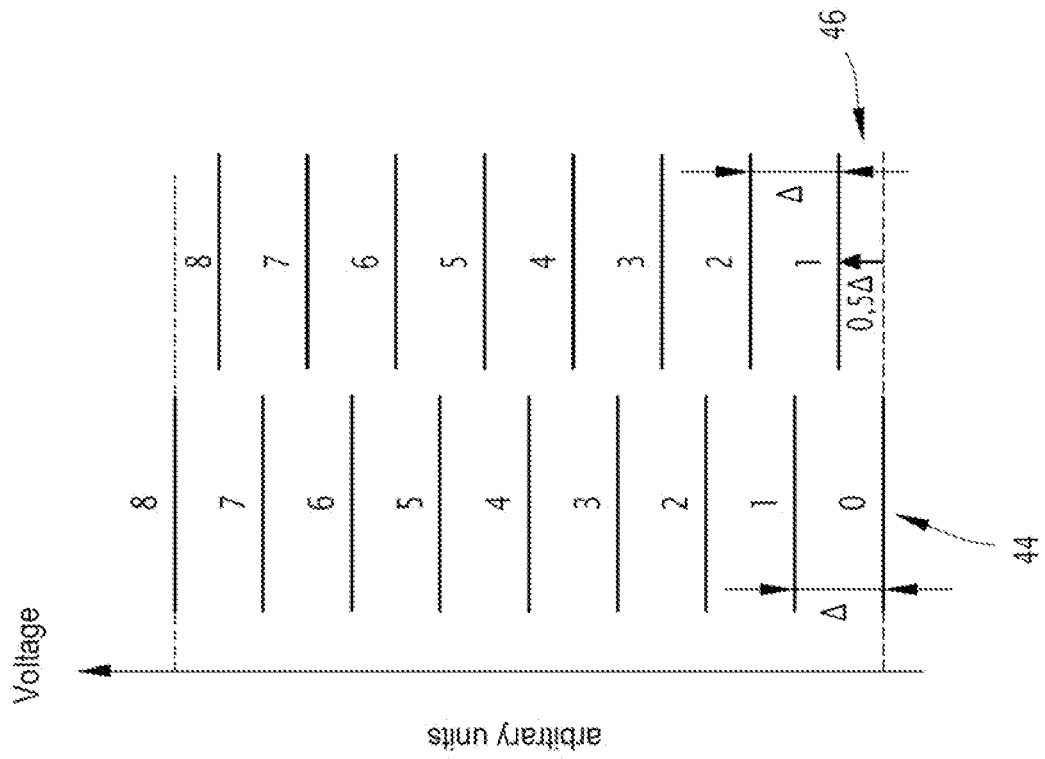
Figure 29:
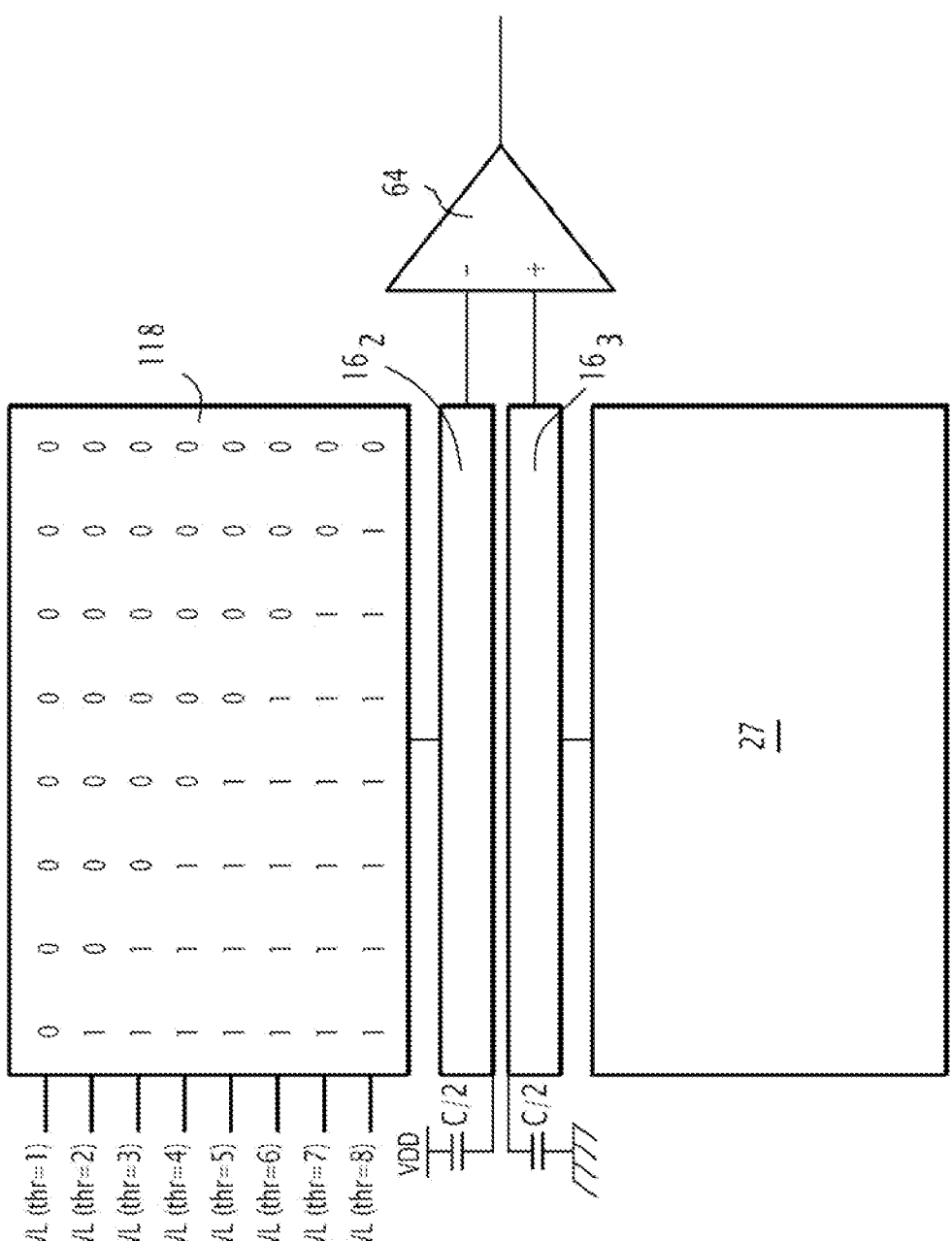
Figure 30:
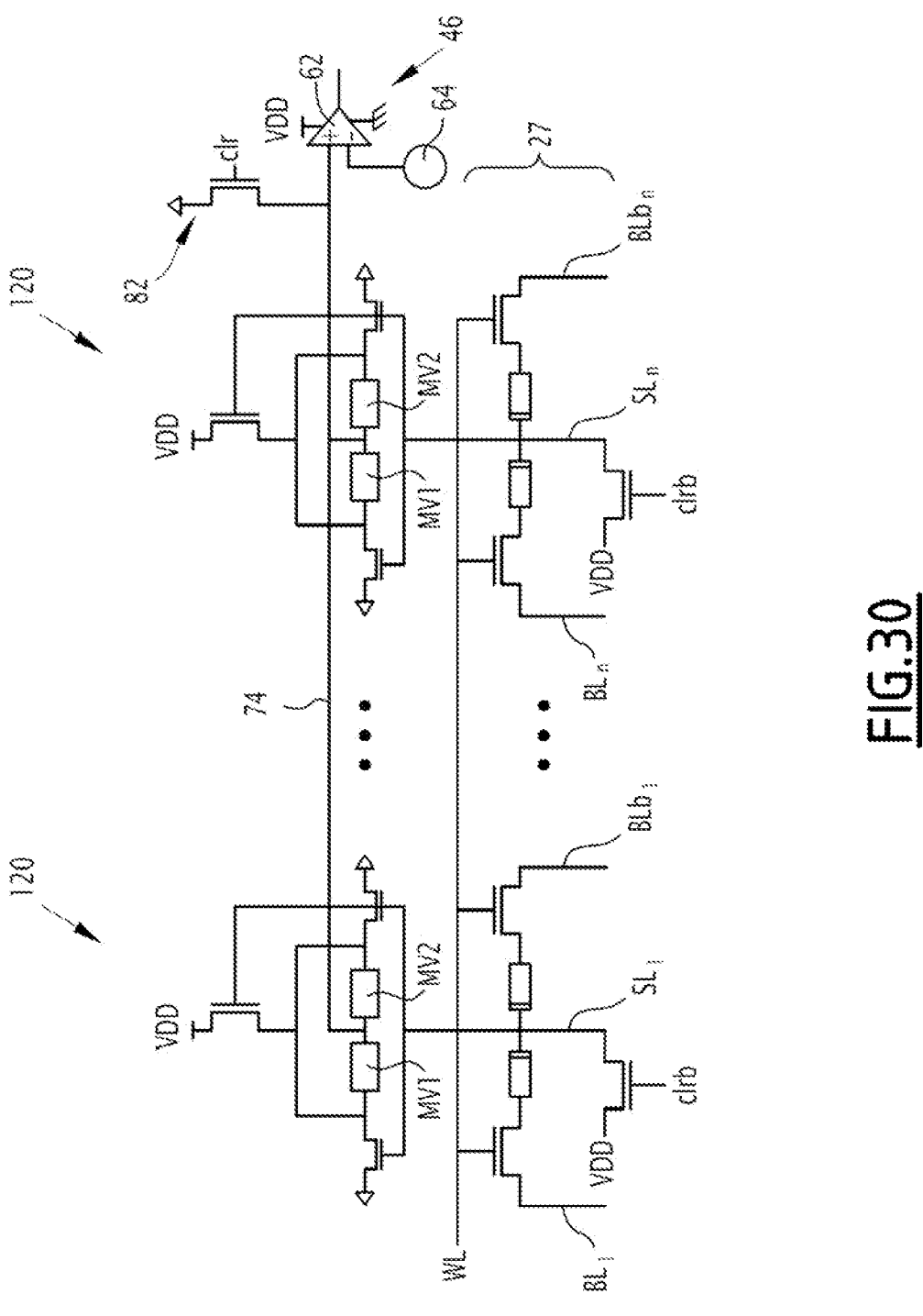
Figure 31:
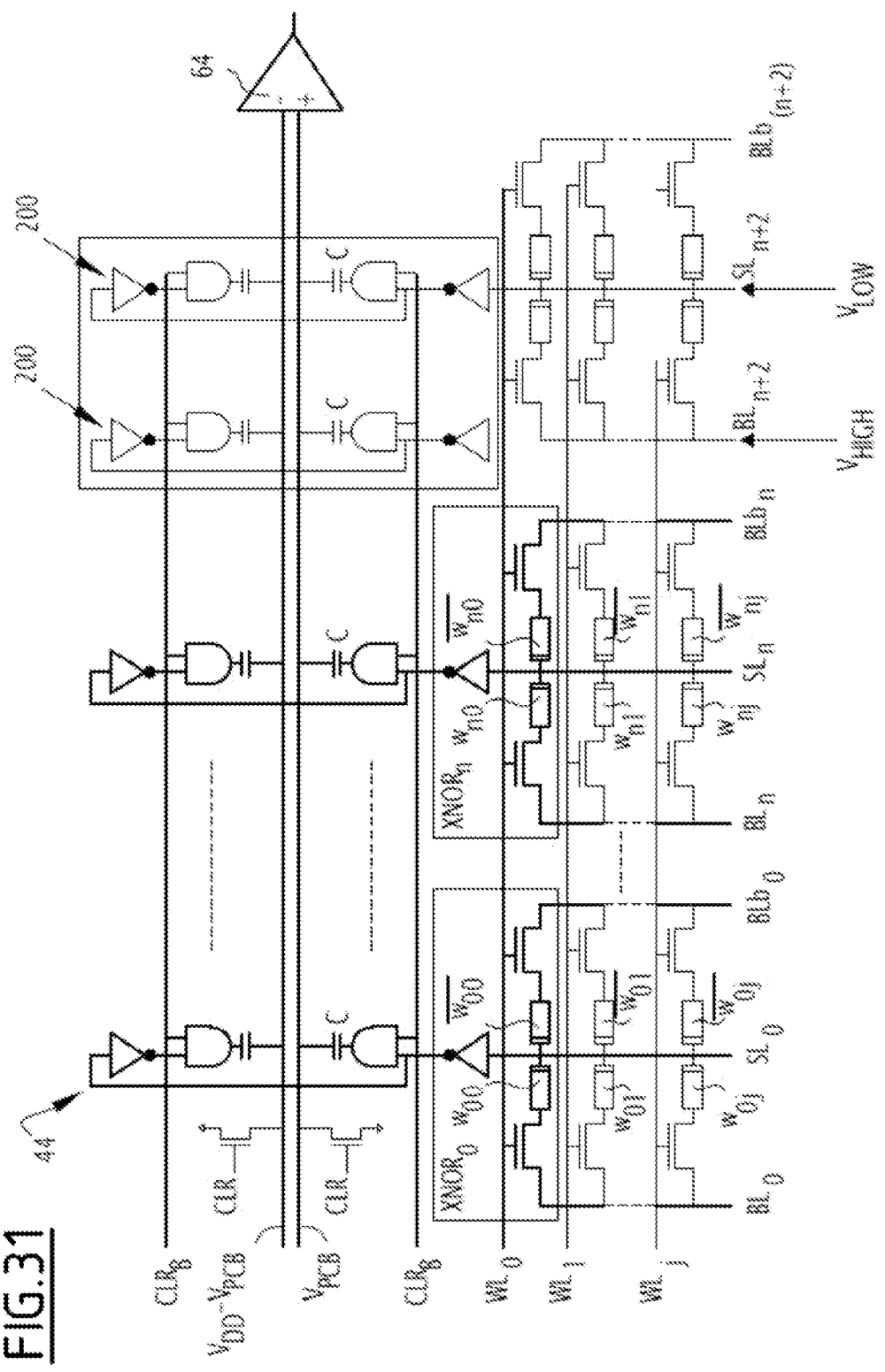
Figure 32:
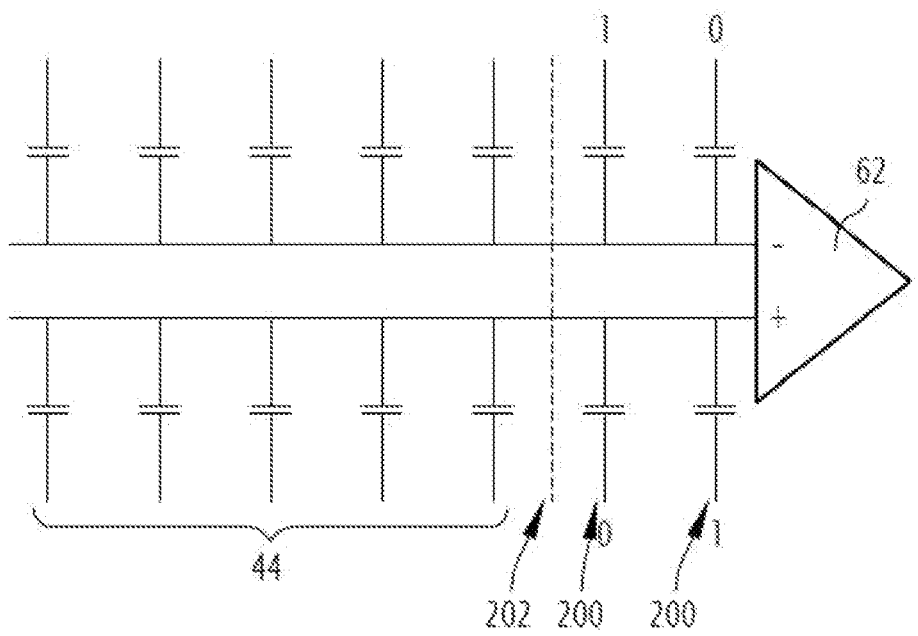
Figure 33:
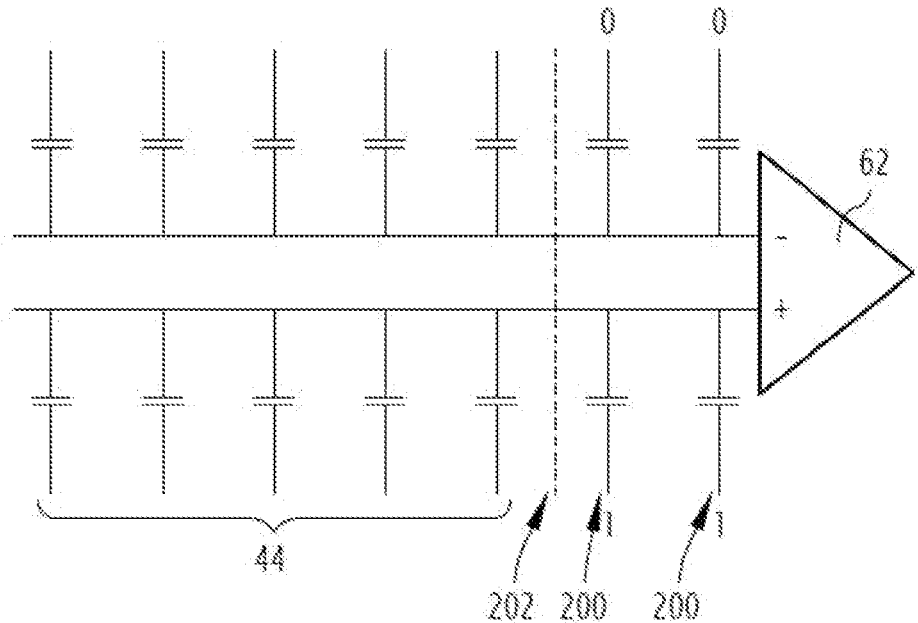
Figure 34:
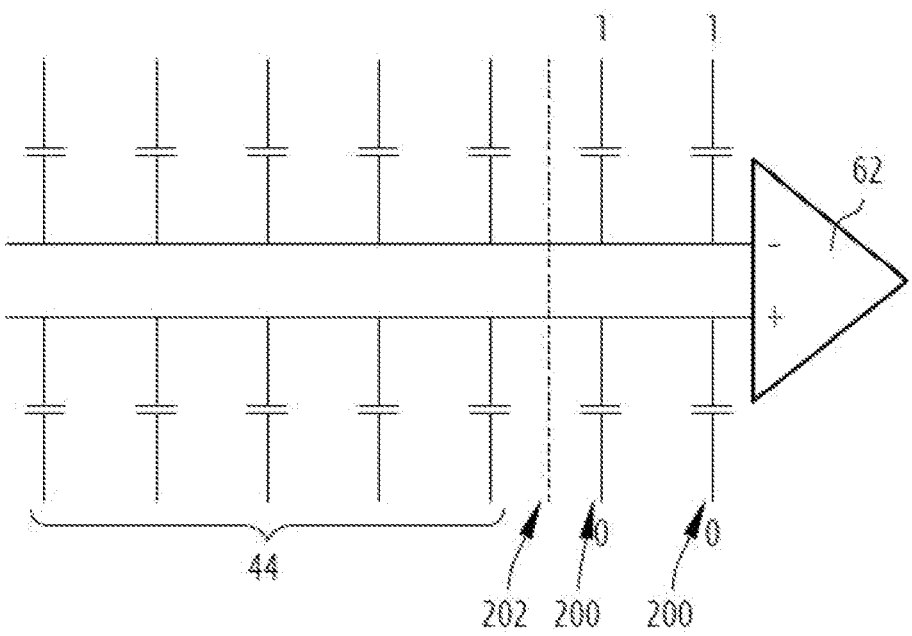
Figure 35:
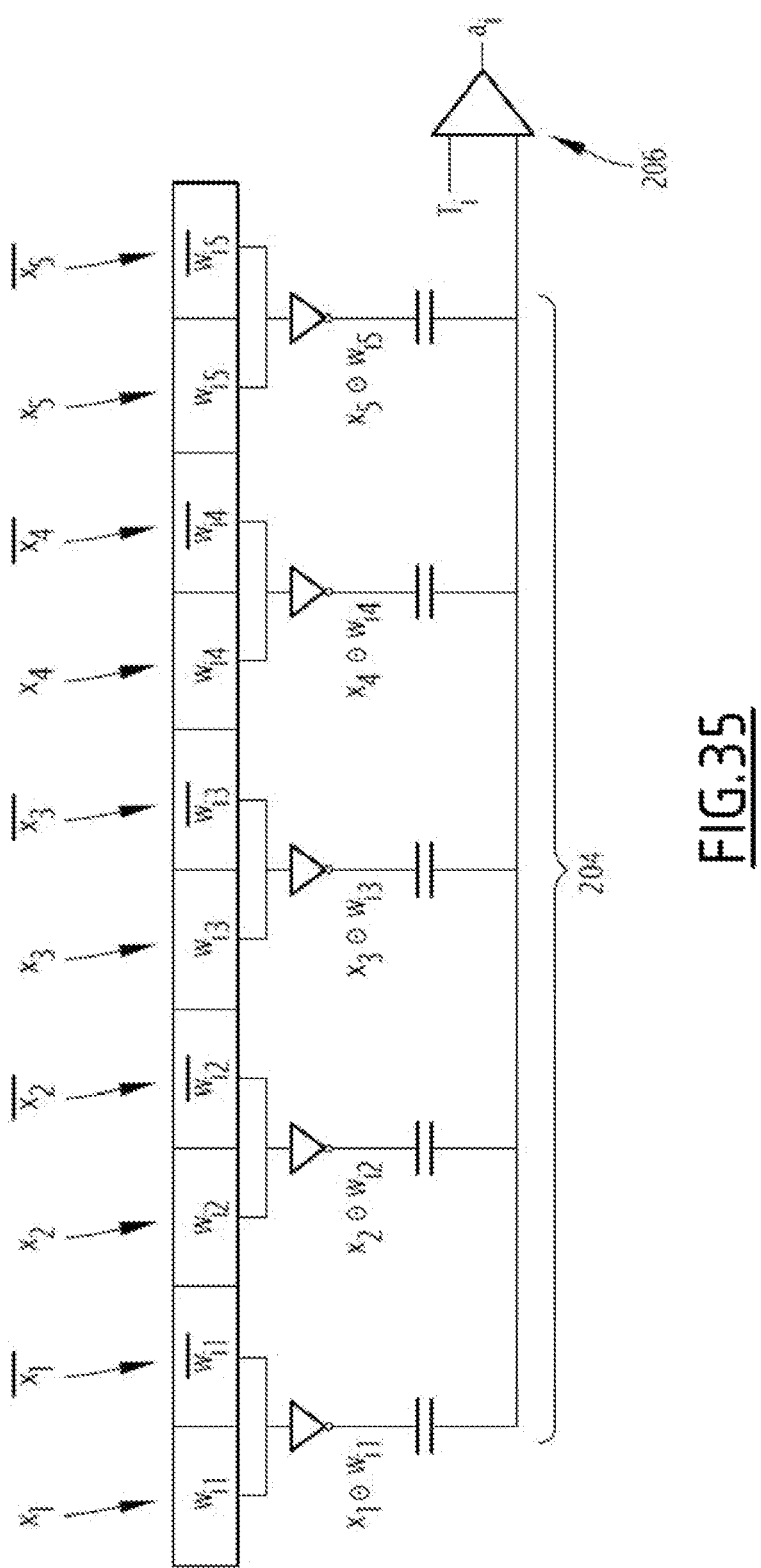
Figure 36:
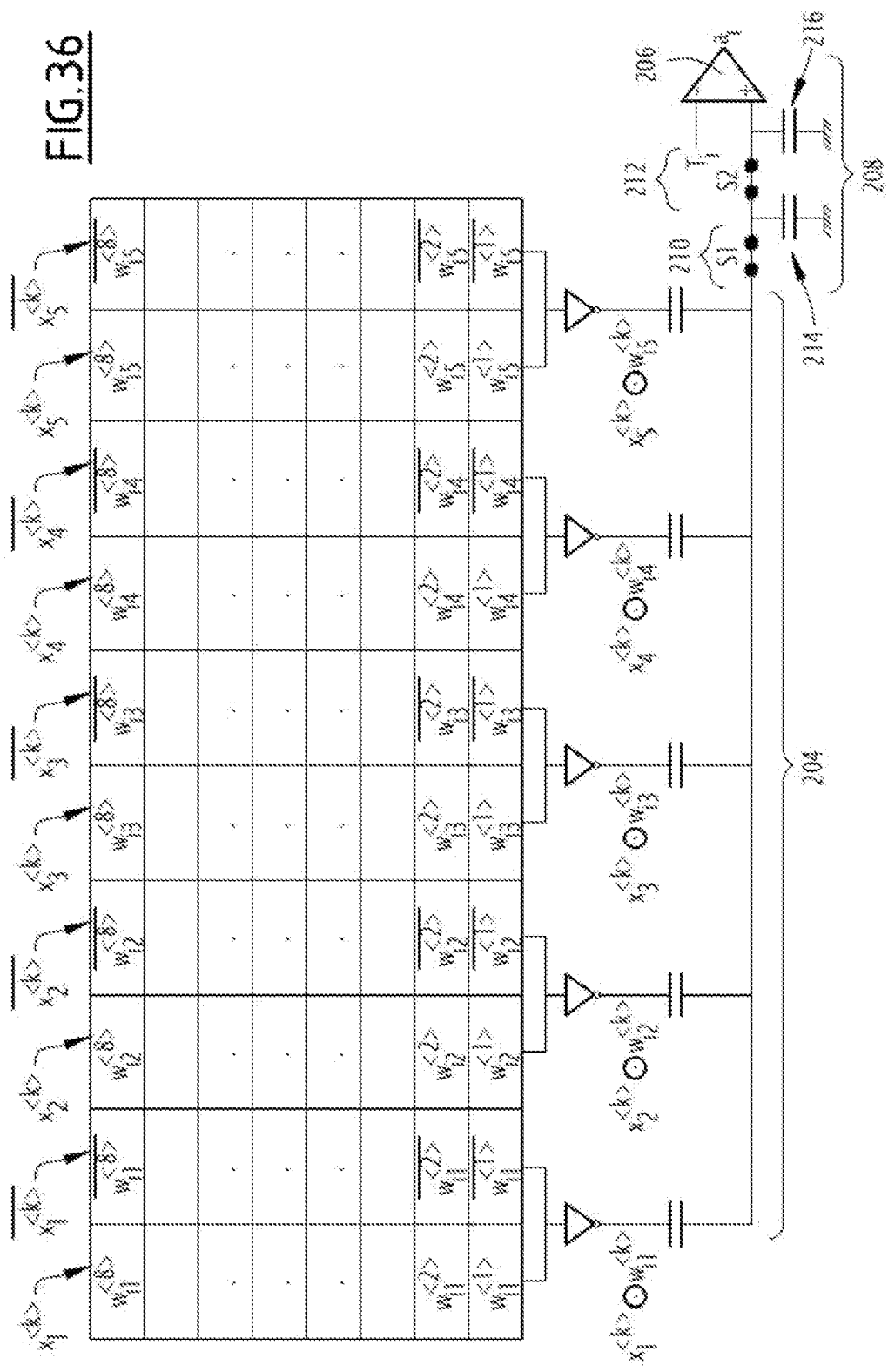
Figure 37:
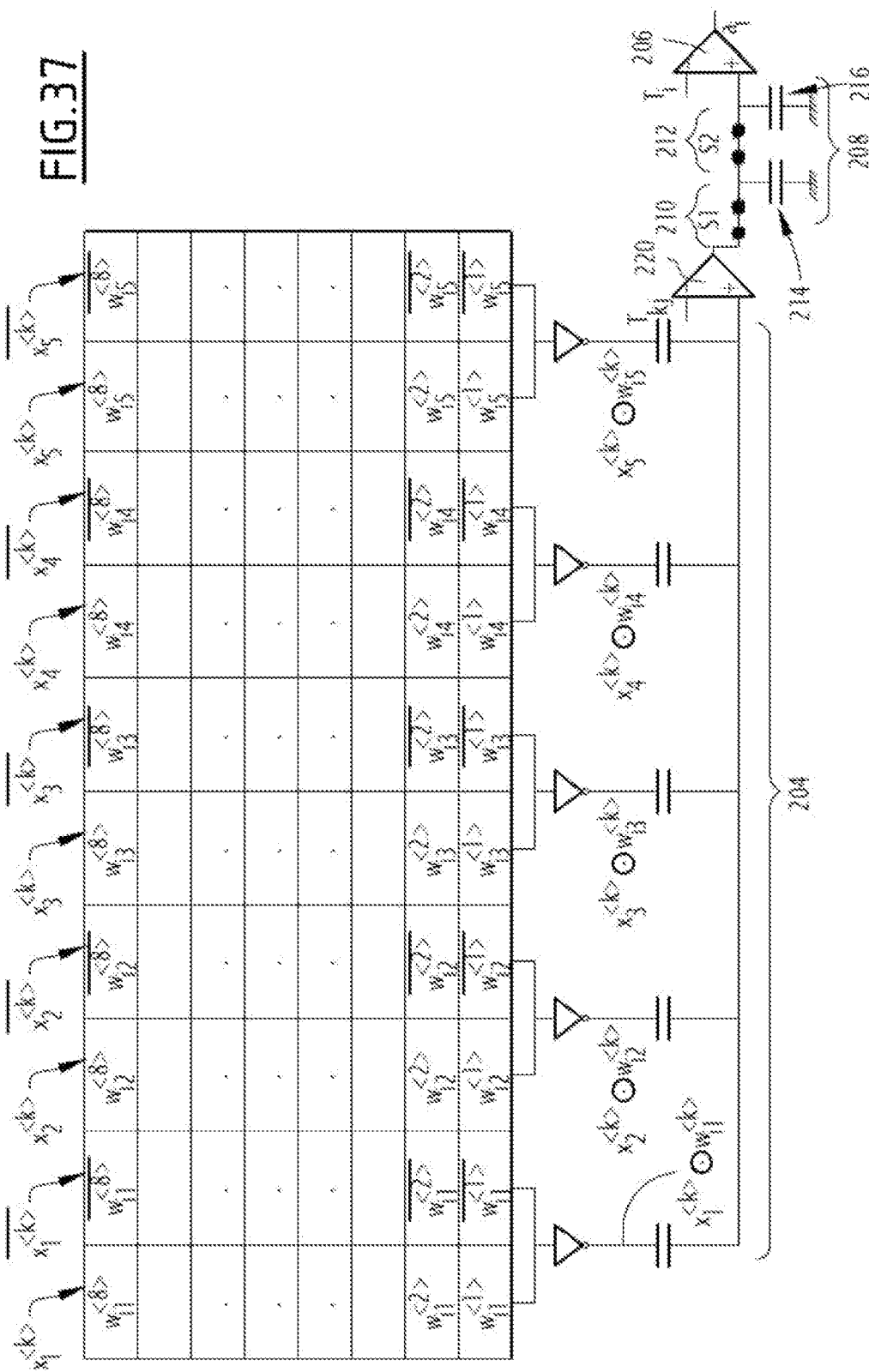
Figure 38:
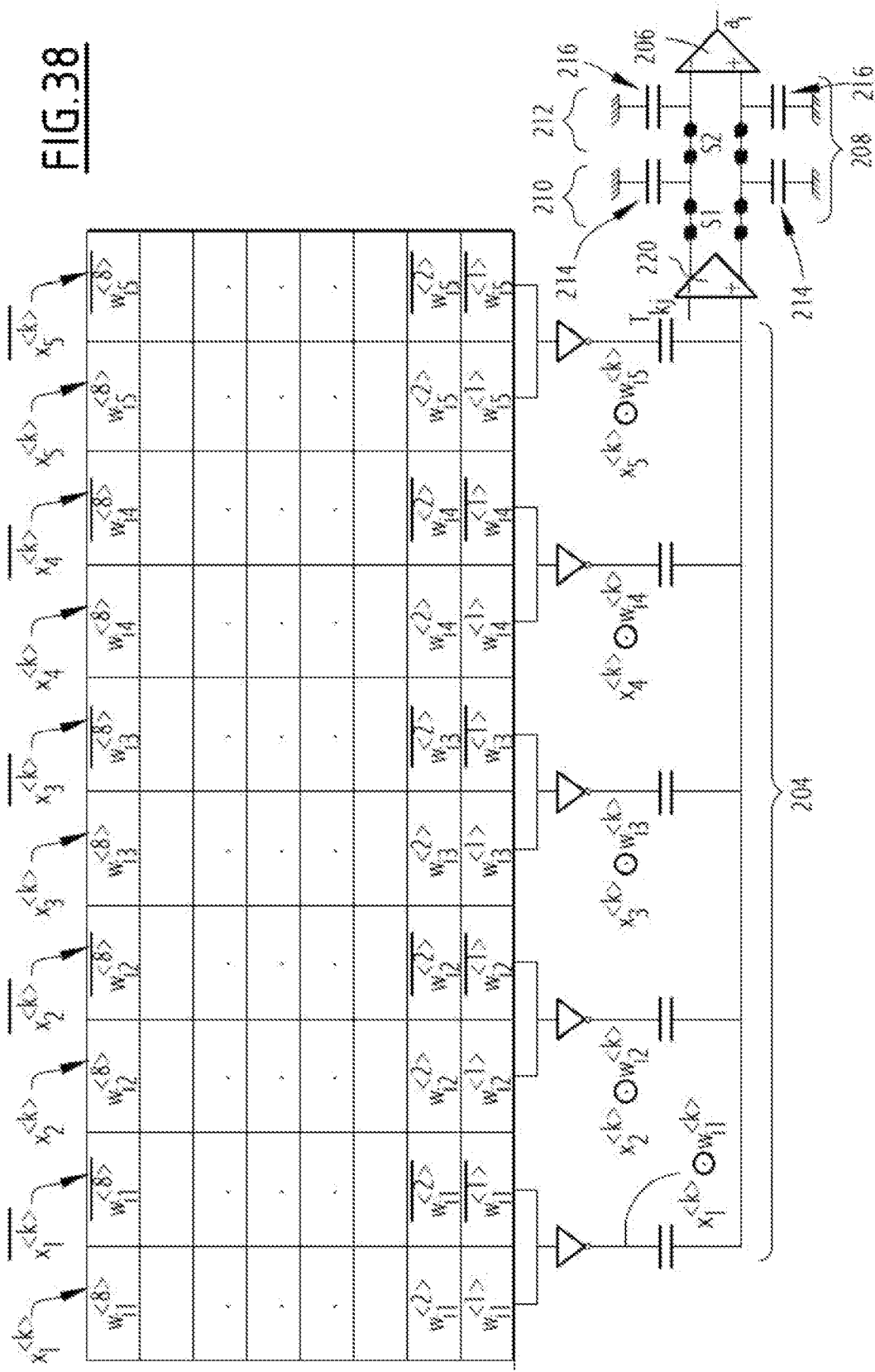

Features and advantages of the invention will become apparent upon reading the following description, given only as a non-limiting example, and making reference to the enclosed drawings, wherein:

FIG. 1 is a schematic representation of an example of a neuromorphic circuit which physically forms a neural network, FIG. 2 is a schematic representation of an example of a memory cell which is part of the neuromorphic circuit, FIG. 3 is a graph showing the effect of the variability of the values of the resistances of the states of a memristor, FIG. 4 is a schematic representation of an example of an electronic circuit implementing a neurone, FIG. 5 is a schematic representation of another example of an electronic circuit implementing a neurone, FIG. 6 is a schematic representation of an example of embodiment of a component performing an XNOR operation and being part of the neurone of FIG. 4, FIG. 7 illustrates the four possible cases of operation of the XNOR component of FIG. 6, FIG. 8 is a schematic representation of the output voltage of the XNOR component of FIG. 6 in certain cases of FIG. 7, FIG. 9 is a schematic representation of a circuit implementing the neurones of the neuromorphic circuit based on static random access memories according to a first document of the prior art, FIG. 10 is a schematic representation of a first circuit implementing the neurones of the neuromorphic circuit based on static random access memories according to a second document of the prior art, FIG. 11 is a schematic representation of the electronic circuit by directly transposing the circuit of FIG. 9 for the case of a resistive memory cell, FIG. 12 is a schematic representation of a concrete implementation of a first neurone part of FIG. 4, FIG. 13 is a schematic representation of an inverter in MOS technology, FIG. 14 is a schematic representation of a first example of an inverter formed from an RRAM cell, FIG. 15 is a schematic representation of a second example of an inverter formed from a RRAM cell, FIG. 16 is a schematic representation of two series inverters formed from two RRAM cells, FIG. 17 is a schematic representation of the implementation of a first step of a method for changing from unformed RRAM cells to the two inverters of FIG. 16, FIG. 18 is a schematic representation of the implementation of a second step of a method for changing from unformed RRAM cells to the two inverters of FIG. 16, FIG. 19 is a schematic representation of the implementation of a third step of a method for changing from unformed RRAM cells to the two inverters of FIG. 16, FIG. 20 is a schematic representation of a concrete implementation of the entire neurone of FIG. 4, FIG. 21 is a schematic representation of the implementation of FIG. 20 in an erasure configuration, FIG. 22 is a schematic representation of an example of implementation of the neuromorphic circuit with computations performed in parallel, FIG. 23 is a schematic representation of another example of implementation of the neuromorphic circuit with computations performed in parallel, FIG. 24 is a schematic representation of yet another example of implementation of the neuromorphic circuit with computations performed in parallel, FIG. 25 is a schematic representation of another example of a neuromorphic circuit, FIG. 26 is a schematic representation of an equivalent electrical diagram of a part of the neuromorphic circuit of FIG. 25, FIG. 27 is a schematic representation of an equivalent electrical diagram of another part of the neuromorphic circuit of FIG. 25, FIG. 28 is a graph showing the different possible configurations of the two parts shown in FIGS. 26 and 27, and FIG. 29 is a schematic representation of yet another example of a neuromorphic circuit, FIG. 30 is a schematic representation of another example of a neuromorphic circuit, FIG. 31 is a schematic representation of yet another example of a neuromorphic circuit, FIGS. 32 to 34 are a schematic representation of the operation of yet another example of a neuromorphic circuit, FIG. 35 is a schematic representation of part of a neuromorphic circuit for one-bit inputs, and FIGS. 36 to 38 are a schematic representation of part of a neuromorphic circuit for multi-bit inputs.

A neuromorphic circuit 10 suitable for implementing a neural network is shown in FIG. 1.

The neuromorphic circuit 10 produces here a binary neural network, i.e., as explained above, a network for which the synaptic weights and the neurones are binary.

The neuromorphic circuit 10 includes a plurality of elementary cells 12.

The elementary cells 12 are organized according to a two-dimensional matrix 14 which includes rows 16 and columns 18.

Hereinafter in the description, the matrix will be referred to as the cell matrix 14i.

An elementary cell 12 has the coordinates (i,j) when said elementary cell 12 is positioned at the intersection of the i-th line 16$_i$ and the j-th column 18$_j$ where i and j are two integers.

In the case of FIG. 1, the number of rows 16 and columns 18 is equal to N, so that the indices i and j are broadly comprised between 1 and N.

In the case of FIG. 1, a cell matrix 14 is shown for which N is equal to 9.

However, as a variant, the number of rows 16 and columns 18 may be different.

The neuromorphic circuit 10 also comprises word lines WL, pairs of complementary bit-lines BL and BLb, source lines SL and two controllers 20 and 22.

In the preceding notations, a word line is referred to as WL, the abbreviation WL corresponding to the name "word line"; the complementary bit-lines BL and BLb use the symbol BL which refers to the corresponding name "bit-line" and the source lines are referred to by the symbol SL which corresponds to the name "source line".

In the example of FIG. 1, each elementary cell is connected to a corresponding word line WL, a corresponding source line SL and a corresponding pair of complementary bit-lines BL and BLb.

Each elementary cell 12 of the same line 14 shares the same word line WL, so that the word lines WL can also be indexed with the index i. Thus, the first word line, i.e. the one which connects the elementary cells 12 of the first line 16, can be referred to by WL$_1$.

The elementary cells 12 of the same column 18 share the same pair of complementary bit-lines BL and BLb the same source line SL. These three lines can therefore also be indexed with the index j.

For clarity, all the source lines SL are represented but only the pairs of complementary bit-lines BL and BLb of the first column 18$_1$, of the fifth column 18$_5$ and of the ninth column 18$_9$ are shown in the long and short dash lines in FIG. 1.

The first controller 20 is suitable for controlling each word line WL while the second controller 22 is suitable for controlling the pairs of complementary bit-lines BL and BLb and the source lines SL.

The first controller 20 and the second controller 22 are configured for being controlled in a coordinated manner for controlling the elementary cells 12 using the lines same control according to the desired operation.

In particular, the second controller 22 can bring the input data flowing along each of the pairs of complementary bit-lines BL and BLb. Such input data will feed the neural network produced by the neuromorphic circuit 10.

In the example described, the elementary cells 12 of the first three lines 16$_1$, 16$_2$ and 16$_3$ are used to produce a neurone of the neural network. The elementary cells 12 are thus part of an electronic circuit implementing a neurone 24. By abuse of language in order to simplify the description which follows, such an electronic circuit is simply referred to as the neurone 24.

The elementary cells 12 of the first three lines 16$_1$, 16$_2$ and 16$_3$ will be subsequently described when the neurone 24 will be described.

The elementary cells 12 of the other lines 16$_4$ to 16$_N$ are each associated with a corresponding binary weight of the neural network.

The elementary cells 12 of the lines 16$_4$ to 16$_N$ serve for storing the weights of the neural network.

For this reason, hereinafter, the elementary cells 12 of the lines 16$_4$ to 16$_N$ are referred to as the memory cells 26 and form a storage assembly 27.

The structure of a memory cell 26 in the line environment is shown more precisely in FIG. 2 for the case of the memory cell 26 having the coordinates (i,j).

Each memory cell 26 includes two memristors, namely a first memristor 28 and a second memristor 30, along with two switches, a first switch 32 and a second switch 34.

Due to the presence of the memristors 28 and 30, such a memory cell 26 is a resistive random access memory cell. The memory cell 26 is more often referred to by the acronym RRAM or ReRAM which corresponds to the name "resistive random-access memory".

Furthermore, such an arrangement is generally called a 2T2R structure with reference to the presence of the two switches (called 2T) and of two memristors (called 2R).

The memory cell 26 is sometimes called 2T2R cell.

A memristor is a component with a value of the electrical resistance thereof which changes permanently, when a current is applied. Thus, a datum can be recorded and rewritten by a control current. Such behavior is observed in particular in phase-change materials, ferroelectric tunnel junctions or redox memories containing oxides such as $HFO_x$ or $Tio_{2-x}$.

The change of conductance in a memristor depends on the amplitude and duration of the voltage pulses applied through the memristor and on the maximum value of the current which can flow through the memristor, e.g. for a "SET" operation, i.e., the change from a high resistance to a low resistance.

A memristor can thus have two states, a high state and a low state.

The high state corresponds to a high resistance and is generally called by the abbreviation HRS referring to the term "High Resistive State. The high state is, thus called hereinafter a high state HRS.

The low state corresponds to a low resistance and is generally called by the abbreviation LRS referring to the term "Low Resistive State. The low state is, thus called hereinafter a low state LRS.

However, due to the variability of the memristors in operation, it turns out that the resistance in the high state HRS can be lower than the resistance in the low state LRS, which generates errors if the information (weight) is encoded in only one memristor.

Such variability is schematically shown in FIG. 3. This figure proposes the probability that a memristor has in practice a resistance value depending on the state of the memristor.

More precisely, the first curve, the curve called 36, schematically represents the probability for all the values observed in practice for the low state LRS, while the second curve 38 represents the same curve for the high state HRS.

The graph in FIG. 3 clearly shows that there is an overlap zone 40. In the overlap zone 40, it may be impossible to distinguish the low LRS and high HRS states.

The overlap may be greater with the long-term drifts over time of the memristors.

To remedy such problem, in the present example, the information is coded by the ratio between the two resistances of the two states by means of a differential configuration of the two memristors 28 and 30.

Thus, according to the example described, the memristors 28 and 30 are complementary memristors in series which follow the same logic coding.

Complementary means herein that the memristors 28 and 30 have a different state, a low state LRS for one and a high state HRS for the other.

According to the example in FIG. 2, a high weight, i.e. a logic "1", is represented by a high state HRS of the first memristor 28 (a low state LRS of the second memristor 30, respectively) while a low weight, i.e. a logic "0", is represented by a low state LRS of the first memristor 28 (a high state HRS of the second memristor 30, respectively).

In the example described, each of the two memristors 28 and 30 is connected to the common source line SL.

Each of the two switches 32 and 34 is e.g. a transistor and more specifically a field effect transistor.

A field-effect transistor is often referred to by the abbreviation FET which corresponds to the name Field-effect transistor".

According to the example described, the two switches 32 and 34 are insulated-gate field effect transistors. Such a transistor is more often referred to by the acronym MOSFET corresponding to the name "Metal Oxide Semiconductor Field effect Transistor".

Thus, each switch 32 and 34 has three electrodes, a gate G, a source S and a drain D.

In general, for a transistor whose reference sign is X, the electrodes will be shown in the figures with the following notation: the gate XG, the source XS and the drain XD.

This notation is chosen herein in order to simplify the representation, knowing that the positions of the source XS and of the drain XD are defined with respect to the main bias direction, i.e. the most used direction for the set-up. Of course, if the bias is reversed, a person skilled in the art knows that the roles and positions of the source XS and of the drain XD are interchanged.

Each gate 32G and 34G of the two switches 32 and 34 is connected to the word line WL. Depending on the voltage level on the word line, the switches 32 and 34 are turned either on or off. The first controller 20 will in practice choose to select a row of cells by making the switches of the memory cells of the row conducting.

The source 32S of the first switch 32 is connected to the bit-line BL while the source 34S of the second switch 34 is connected to the complementary bit-line BLb.

The drain 32D of the first switch 32 is connected to one terminal of the first memristor 28, the other terminal of the first memristor 28 being connected to the common source line SL.

The drain 34D of the second switch 34 is connected to one terminal of the second memristor 30, the other terminal of the second memristor 30 being connected to the common source line SL.

The second controller 22 will control the supply of the pairs of bit-lines, so that the voltage applied on a bit-line $BL_i$ is different and complementary to the voltage applied on the complementary bit-line $BL_j$. Thus, when a cell of coordinate i,j is selected (the switches thereof being turned on through the activation voltage applied to the associated word line $WL_i$), the memristors 28 and 30 of said cell are in series and form a resistive bridge between the bit-lines $BL_i$ and $BLb_j$.

In the present case, the memristors 28 and 30 are thus supplied with voltages applied on the bit-lines $BL_j$ and $BLb_j$ symmetrical with respect to a so-called mid-voltage e.g $$\frac{V_{dd}}{2}.$$

In this notation, $V_{dd}$ corresponds to a supply potential $V_{dd}$. Moreover, hereinafter the ground is called indifferently GND or gnd. Of course, another mid-voltage could be chosen, such as, e.g., a voltage of $$\frac{V_{dd}}{3}.$$

The neurone 24, i.e. the electronic circuit implementing same, is now described with reference to FIGS. 4 to 8.

To understand what follows, one should note that a binary neural network has a specificity in the inference compared to a conventional neural network.

When a conventional neural network is applied to an input vector for calculating an output vector, each neurone receives input values corresponding to output values from neurones in a previous layer $a_j$ and performs a weighted sum $\Sigma_j W_{ij} \cdot a_j$, and the neurone then applies a non-linear function $f$ to the result of the weighted sum.

In contrast, in a binary neural network, the weighted sum is obtained by performing the following operation:

$$a_i = \mathrm{sign}[\mathrm{popcount}_j(XNOR(W_{ij}, a_j)) - T_i]$$

Where:

$a_i$ and $a_j$ represent the output values calculated by the neurones of the current layer, and by the previous layer, respectively;

$W_{ij}$ represents the corresponding binary weights for the neurones in the current layer;

XNOR is the logic function giving the complement to the XOR function (for this reason, this function is sometimes referred to as XNOR);

popcount is the function which counts the number of 1s in a series of bits.

$T_i$ is a predefined threshold, and sign is a function which associates the value 1 with a positive input and associates $-1$ with a negative value.

This means that, in the case of a binary network, it is possible to physically form the neurone 24 as shown in FIG. 4, namely that the neurone 24 includes XNOR components 42, a counting unit 44 and a comparison unit 46.

To understand the functioning of the neurone 24, the operation of one XNOR 42 component is first explained with reference to FIG. 6.

The XNOR component 42 performs an XNOR operation on two signals, namely a weight called W and an input signal denoted "in".

In such a case, the XNOR component 42 includes two memristors M1 and M2 and an inverter 48.

The two memristors M1 and M2 are complementary memristors connected in series corresponding to the weight W.

Thus, in the same way as described above, according to the example of FIG. 6, a logic "1" is represented by a high state HRS of the memristor M1 (the other memristor M2 being in the low state LRS) while a logic "0" is represented by a low state LRS of the memristor M1 (the other memristor M2 being in the high state HRS).

The memristors M1 and M2 are connected at one end to the inverter 48 and at the other end to a corresponding voltage.

The first voltage will be called $V_{in}$ and the second voltage, $V_{inb}$.

The electrical configuration is thus that of a voltage divider bridge 50 connected to the first voltage $V_{in}$ and to the second voltage $V_{inb}$ and the midpoint 52 of which is connected to the input of the inverter 48. In other words, one of the memristors M1 is subject to a voltage $|V_{in} - V_{mid}|$ and the other memristor M2 is subject to a voltage $|V_{mid} - V_{inb}|$. The notation $V_{mid}$ refers to the voltage of the midpoint 52 of the divider bridge 50.

Thus, in the case described, the input signal "in" corresponds to the pair of the first voltage $V_{id}$ and the second voltage $V_{inb}$.

The voltages $V_{in}$ and $V_{inb}$ have the particularity of being symmetrical with respect to half the supply potential $$\frac{VDD}{2}.$$

in practice, $V_{in}$ can be advantageously chosen to be equal to VDD or gnd, and $V_{inb}$ equal to gnd or VDD, respectively.

In the example described, the input signal "in" codes for a logic "1" when the first voltage $V_{in}$ is strictly higher than the second voltage $V_{inb}$, i.e. $V_{in} > V_{inb}$.

Conversely, the input signal in codes for a logic "0" when the first voltage $V_{in}$ is strictly lower than the second voltage $V_{inb}$, i.e. $V_{in} < V_{inb}$.

Such a schematic representation of two memristors M1, M2 in series between two voltages $V_{in}$ and $V_{inb}$ corresponds in practice to the equivalent circuit formed by a selected cell 26 (the associated word line WL has a voltage turning the switches thereof on) and receiving, via the bit-lines BL and BLb, bias voltages corresponding to $V_{in}$ and $V_{inb}$. In other words, the input signal "in" is brought to a selected cell via the associated bit-lines BL and BLb, by the action of the controller 22. The midpoint 52 of the divider bridge then corresponds to the source line SL connected to the cell considered.

The inverter 48 is an element suitable for receiving an incident signal on an input 48E and for performing a logic inversion computation to output an output signal 48S which is the inverse of the incident signal.

Herein, the input 48E of the inverter 48 is connected to the midpoint 52 of the divider bridge 50 formed by the two memristors M1 and M2.

The output 48S of inverter 48 gives the result of the XNOR operation applied to the input signal "in" and to the weight W.

The functioning of the XNOR component 42 is now described with reference to FIGS. 7 and 8 which schematically represent, respectively, the four possible operation cases of the XNOR component 42 and the value of the output voltages for two of the four possible cases. In this figure, to keep the figures light, the reference signs are not shown.

More precisely, the case at the top left of FIG. 7 corresponds to the case where the input signal "in" is equal to 0 and the value of the weight W is equal to 0.

In such a case, as explained above, the first voltage $V_{in}$ is strictly lower than the second voltage $V_{inb}$, i.e. that $V_{in} < V_{inb}$ (with e.g. $V_{in} = $gnd and $V_{inb} = $Vdd).

Furthermore, the first memristor M1 is in the low state LRS while the second memristor M2 is in the high state HRS.

Due to the configuration, the memristor in the high state HRS absorbs almost all of the voltage dynamics, pushing the voltage $V_{mid}$ from the midpoint 52 toward the voltage at the end of the memristor in the low state LRS.

In this case, this means that the voltage $V_{mid}$ of the midpoint 52 is pushed back toward the first voltage Vin as shown schematically by the curve 54 in FIG. 8.

As can be seen in FIG. 8, the mid-point voltage $V_{mid}$ is distinctly below half the supply potential $$\frac{VDD}{2}.$$

The output "out" of the inverter 48 is then at 1.

This shows that for a signal "in" at 0 and for a weight at 0, the output of inverter 48 is then at 1, which corresponds to XNOR(0,0)=1.

The case at the bottom right of FIG. 7 corresponds to the corresponding case wherein the input signal "in" is equal to 0 and the value of the weight W is equal to 1.

In such a case, compared with the previous case, the only difference is that the first memristor M1 is in the high state HRS while the second memristor M2 is in the low state LRS.

As a result, the voltage of the midpoint $V_{mid}$ is pushed back toward the second voltage $V_{inb}$, as shown schematically by the curve 56 in FIG. 8.

The output "out" of the inverter 48 is then at 0.

This shows that for a signal "In" at 0 and for a weight at 1, the output of inverter 48 is then at 1, which corresponds to XNOR(0,1)=0.

The same remarks apply for the cases on the right-hand side in FIG. 7.

The case at the top corresponds to an input signal "in" equal to 1($V_{in}>V_{inb}$, with e.g. $V_{in}=V_{dd}$ and $V_{inb}$=Gnd) and a weight equal to 0 (the first memristor M1 in the low state LRS and the second memristor M2 in the high state HRS) so that the mid-point voltage $V_{mid}$ is pushed back toward the first voltage $V_{in}$, i.e.

$$V_{mid} > \frac{VDD}{2}.$$

As a result, the output "out" of inverter 48 is at 0. This corresponds indeed to performing the XNOR(1,0)=0 operation.

The bottom case corresponds to an input signal "in" equal to 1 ($V_{in}>V_{inb}$) and a weight equal to 1 (the first memristor M1 in the high state HRS and the second memristor M2 in the low state LRS) so that the midpoint voltage $V_{mid}$ is pushed back toward the second voltage $V_{inb}$, i.e.

$$V_{mid} < \frac{VDD}{2}.$$

As a result, the output "out" of inverter 48 is at 1. This corresponds indeed to performing the XNOR(1,1)=1 operation.

The various cases described indeed lead to obtaining the truth table visible in FIG. 7, which clearly illustrates that the output "ou"t of the inverter performs an XNOR operation.

Such an XNOR component 42 is used for obtaining a voltage output which does not have the variability of resistance of the memristors M1 and M2.

The reduction in variability comes from two complementary elements.

A first reduction of the variability is obtained by using the differential set-up of the two memristors M1 and M2. Nevertheless, at the mid-point 52 of the divider bridge 50, the signal is still subject to the variabilities of the memristors M1 and M2. In fact, the voltage of the midpoint depends on the ratio between the values of the resistances of the memristors M1 and M2, which reduces the variability, but not completely.

The second reduction in variability is obtained by using the inverter 48 as shown with reference to FIG. 8.

As a result, the signal at the output of the inverter 48 is not sensitive to variations in the resistance of the memristors.

According to the example of FIG. 4, the counting unit 44 consists of a capacitive bridge 58.

As indicated above, the counting unit 44 is suitable for counting the number of 1s in a series of bits, i.e. to implement a popcount operation.

A capacitive bridge 58 is a set of capacitors 60 connected in parallel and connected together at one of the terminals thereof.

Moreover, according to the example described, each capacitor 60 has the same capacitance value.

Each capacitor 60 is connected to the own XNOR component 42 thereof.

As a result, the output voltage of the counting unit 44 is proportional to the number of 1s at the output of the XNOR components 42.

The output 44S of the counting unit 44 is connected to the comparison unit 46 which is used to compare an incident voltage with a comparison voltage.

More precisely, the comparison unit 46 includes two elements: a comparator 62 and a comparison voltage generator 64. The output of the counting unit 44 is thus connected to an input 62E1 of the comparator 62, the other input 62E2 of the comparator 62 being connected to the comparison voltage generator 64.

According to the example described, the comparison voltage generator 64 is a second capacitive bridge 66 the inputs of which are the inverses of the XNOR components 42 of the first capacitive bridge 58.

For this purpose, each capacitor 68 of the second capacitive bridge 66 is connected to an inverter 70 which is connected to a corresponding XNOR component 42.

The comparison voltage generator 64 thus generates a voltage proportional to the number of 0s at the output of the XNOR components 42.

The comparator 62 then compares the two voltages coming from the two capacitive bridges 58 and 66, i.e. here the number of 1s at the output of the XNOR components 42 and the number of 0s at the output of the XNOR components 42.

The comparator 62 generates a "1" at the output if the number of 1s is greater than the number of 0s, and a "0" in the opposite case.

The output of the comparator 62 corresponds to the output of the neurone 24.

According to another example illustrated in FIG. 5, the counting unit 44 is formed by a resistive bridge 96 with N resistors 98 instead of a capacitive bridge.

Moreover, in the case of FIG. 5, the comparison voltage generator 46 is also a resistive bridge 100 which further includes N resistors 102.

Thus, the functioning is similar to that described for the capacitive bridge 56. More precisely, a resistive bridge 96 is thus formed, where a certain number x of resistors 98 are subject to the supply potential VDD (which corresponds to an output at 1 for the associated XNOR component), the N-x other resistors 98 being subject to the ground GND (which corresponds to an output at 0 for the associated XNOR component 42). The voltage obtained is thus an image of the ratio between the number of XNOR components 42 at the value 1 and the number of XNOR components at the value 0.

Such approach has the advantage of working with all resistive memories, even same which cannot work in a capacitive mode.

As a variant, the comparison voltage generator 64 is a generator generating a fixed reference voltage. Typically, the comparison voltage generator 64 can generate a voltage corresponding to one half of the supply potential, namely $$\frac{VDD}{2}.$$

In such a variant, the comparator 62 generates a "1" as the neurone output value if the number of 1s at the output of the XNOR comparisons 42 corresponds to a voltage higher than the reference voltage. Otherwise, the comparator 62 generates a "0" as the neurone output value. At this stage, it should be noted that the proposed use of a capacitive bridge 58 as a counting unit 44 in the case of RRAM cells, is original.

In fact, the use of a capacitive bridge for such a use is found in the prior art only in the case of static random access memories (SRAM) (which comes from the corresponding name "Static Random Access Memory") and in particular in the following two articles:

an article by D. Bankmann et al. entitled "*An always-on 3.8 mµJ/86% cifar* 10 *mixed-signal cnn processor with all memory on chip in* 28-*nm CMOS*" published in 2018 of the ISSCC (International Solid-State Circuits Conference) conference organized by the IEEECC and an article by Hossein Valavi et al. entitled "*A Mixed-Signal Binarized Convolutional-Neural-Network Accelerator Integrating Dense Weight Storage and Multiplication for Reduced Data Movement*" published at the VLSI Circuit Symposium in 2018.

The first article proposes the set-up shown in FIG. 9. As before, for a given neurone, the multiplications between the inputs and the weights are performed using XNOR gates and the popcount operation is performed using the capacitive bridge: each XNOR gate is connected to a capacitor at the output thereof, and all the capacitors are then connected to each other at the other end thereof, thus forming the capacitive bridge. To count the number of '0's at the output of the capacitive bridge, a second bridge is built, this time using XOR gates: the voltage of the second bridge is proportional to the number of '0's at the output of the XNOR gates of the first bridge. Then, the voltages of the two bridges are compared by a comparator generating a value '1' at the output of the neurone if the voltage of the first bridge is greater than the voltage of the second bridge.

The direct application of the structure proposed by the first article to an RRAM memory thus requires reading the weights in RRAM and the inputs in SRAM or RRAM in order to route each of the values read to the capacitive neurone. A complex routing at the periphery of the memory would thus be required for routing to the capacitive neurons, the weights stored in RRAM and the inputs stored in SRAM. This is not conceivable or it is at least much more complex than the present case.

The second article, by Valavi et al., presents the same structure, but by integrating the XNOR operation and the capacities directly into the SRAM cells, thus gaining in terms of bandwidth. FIG. 10 illustrates the structure of the SRAM cell proposed in that article. The set of circuits shown in bold line is used for calculating an XNOR operation between an input value and the weight stored in the SRAM cell, and then for loading the value of the XNOR operation into a capacitor.

The direct application of the structure proposed in this second article to an RRAM makes it possible to obtain the set-up of FIG. 11.

However, once again, such a set-up is not satisfactory. Indeed, such circuit charges the capacitor directly via the memristor, which has the effect of transferring the variability of the memristor to the charge of the capacitor. For this reason, the problem stays, the variability of the memristor always being a limiting factor.

Moreover, adding two transistors within each memory cell increases the overall surface area of the memory, so that not only is the variability still inconvenient, but, moreover, the set-up is more bulky.

By contrast, the present neurone 24 makes it possible to benefit from the advantages of a capacitive bridge 58 (low consumption in particular) while astutely managing the great variability of the memristors as explained above with reference to FIG. 8.

Moreover, as shown in FIG. 1, such a neurone 24 can be produced in a very integrated manner since the neurone 24 can be produced physically on only three lines 16₁, 16₂ and 16₃ of the cell matrix 14.

An example of such an integrated embodiment is now described with reference to FIGS. 12 to 17.

FIG. 12 shows an embodiment of the counting unit 44 on the first line 16₁.

The first line 16, therefore forms the capacitive bridge 58.

Before describing the first line 16₁ more precisely, it should be explained that a memristor works as a programmable resistor as described above with a low state LRS and a high state HRS only after a forming step.

A formation step consists in applying a relatively high voltage (so-called forming voltage) to the memristor, typically a voltage comprised between 3 V and 4 V depending on the technologies used.

In other words, before forming, a memristor is in a so-called virgin state and then after forming, same exhibits the above-mentioned behavior with the high HRS and low LRS states.

In the virgin state, the memristor has a capacitive behavior. Hereinafter, such a memristor is called "virgin memristor" to distinguish same from a formed memristor.

The first line 16₁ shown in FIG. 12 is a line of elementary cells 12 wherein each memristor is a virgin memristor MV1 and MV2. Such a line 16₁ could therefore be considered as a line of capacitive cells 2T2C by identifying each virgin memristor MV1 and MV2 by a "C". To make things clearer, the elementary cells 14 of the first line 16₁ are called capacitive cells 72.

Moreover, the two switches T1 and T2 of each capacitive cell 68 are connected to one another.

In this way, it is possible to put in parallel the two virgin memristors MV1 and MV2 of the same capacitive cell 72. As a result, the capacitance of a capacitive cell 72 is twice as large as the capacitance of one virgin memristor MV1 or MV2.

All the capacitive cells 68 are connected to the same output line 74.

The output line 74 is connected to the midpoint situated between the two virgin memristors MV1 and MV2.

Such an embodiment of the counting unit 44 is advantageous because same is based on a line 16₁ of standard memory cells taken before the step of forming the memristors. The only modifications to be made are to add the output line 74 and the connections of each capacitive cell 72 to the output line 74. The modifications are made simply by modifying the routing of the architecture of the cells (more usually called using the corresponding name "layout") without any change in the architecture itself which is preserved. The architecture of the cells is more usually called using the corresponding name "layout". Herein, it is indeed the layout which is unchanged.

Furthermore, it will be explained later that such an arrangement makes it possible to obtain a procedure for erasing the virgin memristors MV1 and MV2, which is relatively simple to implement.

With reference to FIGS. 13 to 19, it is explained how to make the inversion part of neurone 24 using the second and third lines $16_2$ and $16_3$ of the cell matrix 14.

Before describing in detail the adaptation of the second and third lines $16_2$ and $16_3$, it should be specified that the memory cells 26 use the switches 32 and 34 which are generally NMOS transistors, i.e. N-channel MOSFETs.

Furthermore, it can be recalled that an inverter INV can be formed from transistors as shown in FIG. 13.

The inverter INV includes two transistors TR and TT in series and connected, the left-hand transistor TR being connected to the ground GND and the right-hand transistor TT being connected to the supply potential Vdd. Furthermore, the right-hand transistor TT is connected as a diode.

In such a configuration, the left-hand transistor TR is called a pull-down transistor. The right-hand transistor TT is called a pull-up transistor.

The input of the inverter INV is the gate of the pull-down transistor TR and the output of the inverter INV is the midpoint of the two transistors TR and TT.

Thus, in order to obtain an inverter from a memory cell 26, two set-ups may be envisaged. The first set-up is illustrated in FIG. 14 and the second set-up corresponds to FIG. 15.

In the first set-up, the two memristors M1 and M2 are short-circuited using a short-circuit track $P_{cc}$.

Such an approach involves dimensioning the pull-up transistor TT so that same is more resistive than the pull-down transistor TR, in order to obtain a good quality low level.

In the second set-up, the pull-off transistor TT is always connected as a diode but the short-circuit track $P_{cc}$ is different. Instead of being connected for short-circuiting the two memristors, the short-circuit track $P_{cc}$ is arranged only for short-circuiting the memristor M1 of the pull-down transistor TR. Moreover, the second memristor M2 is placed in the high state HRS.

In the example described, the second memristor M2 is to be placed in the high state HRS because the upper electrode (more usually referred to as the "top electrode" with reference to the corresponding English name) is connected to the midpoint of the 2T2R structure. Of course, in a set-up where the bottom electrode is connected to the midpoint, it would be appropriate to place the second memristor M2 in the low state LRS.

Such an approach makes it possible to obtain a more resistive pull-down transistor TR without making more resistive the pull-up transistor TT which is connected as a diode. In such a set-up, there are only modifications of connectors and not of the architecture of the cells, as indicated above.

The two set-ups can be integrated into the cell matrix 14 by being implemented on only one row 16 of memory cells 26.

Nevertheless, with reference to FIG. 16, it is more favorable to connect two inverters 48 and 76 in series, as will be explained hereinafter.

The first inverter 48 and the second inverter 76 each have the structure described in FIG. 15, denoting each element by a "1" in the reference sign for the first inverter 48 and by a "2" for the second inverter 76.

With these notations, it is the first memristors M11 and M21 which are short-circuited in the first inverter 48 and the second inverter 76, respectively.

The input 48E of the first inverter 48 is intended for being connected to a source line and is connected to the first transistor TR1 of said inverter.

The output 48S of the first inverter 48 is connected to the input 76E of the second inverter 76 and thereby to the first transistor TR2 of the second inverter 76.

The output 76S of the second inverter 76 is intended for being connected to the counting unit 44.

Thus, in such configuration, it means that the neurone 24 has two inverters 48 and 76 in series for each capacitor 60 of the bridge 58.

Such a configuration has several advantages.

It should be noted that the input 48E of the first inverter 48 making it possible to perform the XNOR operation, is quite close to one half of the supply potential VDD/2. Consequently, the signal at the output of the first inverter 48 does not necessarily provide two very distant levels "1" and "0". The presence of the second inverter 76 makes it possible to purify the output signal of the first inverter 48 with very well separated high and low levels.

Moreover, such a configuration with two inverters 48 and 76 also makes it possible to keep the memristors MV1 and MV2 of the counting unit 44 in the virgin state thereof. In fact, it is recommended that the voltage across the virgin memristors MV1 and MV2 does not exceed the forming voltage. With the proposed configuration of two inverters 44 and 76 in series, the first inverter 48 can be supplied with a high voltage so as to clearly distinguish the high and low levels, and the second inverter 76 can be supplied with a voltage sufficiently low so as not to exceed the forming voltage of the virgin memristors MV1 and MV2 of the counting unit 44.

Finally, such a configuration can easily be set up as will be shown with reference to FIGS. 17 to 19 which illustrate how, in three successive steps, it is possible to change from two memory cells with virgin memristors to memristors in the high state HRS. This illustration is also produced in the case where the upper electrode of the memristors is connected to the midpoint of the 2T2R structure.

In each of said steps, the word line WL of the counting unit 44 is connected to the ground GND, the gate of the transistors of the two inverters 48 and 76 is connected to the supply potential VDD and the input 48E of the first inverter 48 is connected to ground GND.

The first step illustrated by FIG. 17 consists in making the second memristor M12 of the first inverter 48 change from the virgin state to the low state LRS.

For this purpose, the output 48S of the first inverter 48 is connected to a voltage V1 higher than the forming voltage by activating a switch 78 connected to a first voltage source, and the source TT1S of the first pull-up transistor TT1 is connected to the ground GND.

The second step illustrated by FIG. 18 consists of changing the second memristor M12 of the first inverter 48 from the low state LRS to the high state HRS and in changing the second memristor M22 of the second inverter 76 from the virgin state to the low state LRS.

To obtain the change from the low state LRS to the high state HRS, the output 48S of the first inverter 48 is connected to the ground GND leaving the switch 78 activated but connecting same to the ground. In parallel, the source TT1S of the first pull-up transistor TT1 is connected to the supply potential VDD.

The change from the virgin state to the low state LRS is obtained by connecting the output 76S of the second inverter 76 to a voltage V2 higher than the forming voltage by activating a switch 80 connected to a second voltage source. In parallel, the source TT2S of the second pull-up transistor TT2 is connected to the ground GND.

The third step illustrated by FIG. 19 consists of making the second memristor M22 of the second inverter 76 change from the low state LRS to the high state HRS.

For this purpose, the output 76S of the second inverter 76 is connected to the ground GND, and the source TT2S of the second pull-up transistor T2 is connected to the supply potential VDD. In parallel, the voltages at the terminals of the first inverter 48 are the same as during the second step.

Thus, the working configuration of the two inverters 48 and 76 is easily obtained from two memory cells with virgin memristors.

Through the description of FIGS. 12 to 19, it has been progressively explained how to form the neurone 24 from only three lines $16_1$, $16_2$ and $16_3$ of the cell matrix 14.

FIG. 20 shows the details of the circuits of the three lines $16_1$, $16_2$ and $16_3$ connected together and connected to the immediate environment thereof.

As explained above, the first line $16_1$ makes it possible to obtain the counting unit 44, the second line $16_2$ makes it possible to obtain a set of second inverters 76 and the third line $16_3$ makes it possible to obtain a set of first inverters 48.

In FIG. 20, only the extreme elements of each row 16, i.e. same corresponding to the first column 18, and the last column $18_n$ are shown.

As indicated above, the other lines $16_4$ to $16_N$ are used for storing the weights of the neural network. In FIG. 20, only the fourth line $16_4$ of the storage assembly 27 is shown in order to keep the figure light.

Starting from the fourth line $16_4$ toward the first line $16_1$, the description can be made.

The inputs 48E of the first inverters 48 are connected to a corresponding source line SL coming from the fourth line $16_4$. In the example of FIG. 20, the first source line $SL_1$ is thus connected to the input 48E of the first left-hand inverter 48 and the last source line $SL_n$ is connected to the input 48E of the first right-hand inverter 48.

With reference to FIG. 4 or 6, this means that the memristors M1 and M2 of the XNOR component 42 are the memristors 28 and 30 of a memory cell 26 and that the first voltages Vin and Vinb are produced by the pair of complementary bit-lines BL and BLb. As follows from the explanation given in connection with FIG. 4, the values of the first complementary voltages $V_{in}$ and $V_{inb}$ thus correspond to an input datum value of the neuron, this input datum being applied to the equivalent of a synapse of the neuron realized by the elements of the column of the matrix (in particular the memristors 28 and 30 memorizing the synaptic weights).

As explained above, the outputs 48S of the first inverters 48 are connected to the inputs 76E of the second inverters 76.

Each output 76S of a second inverter 76 is then connected to a capacitive cell 72. In such embodiment, this means that the neurone 24 has two inverters 48 and 76 in series, for each capacitor 60.

In the example proposed, the supply of the two virgin memristors MV1 and MV2 is in parallel so that the capacitances thereof are added up. Furthermore, an output 76S of a second inverter 76 is connected both to the source of the first transistor of a capacitive cell 72 and to the source of the second transistor of the same capacitive cell 72. It can be recalled here that, by convention, in the present document, the concept of source and drain is defined with respect to the main bias direction and that for an reversed bias, the drain and the source are interchanged.

The output line 74 connected to the output of the capacitors 60 is connected to the comparator 62 which is located at the periphery of the cell matrix 14.

The output line 74 is further connected to a pull-down transistor 82 used for erasing, after computation, the virgin memristors MV1 and MV2.

Similarly, a pull-down transistor 84 is inserted on each source line SL for setting the latter to a zero potential.

The operation of the pull-down transistors 82 and 84 is described with reference to FIG. 21 which illustrates the configuration to be used for erasing the virgin memristors MV1 and MV2.

Thus, to implement such an erasure between two computations, it is sufficient to activate the pull-down transistors 82 and 84 while setting the word lines WL to the ground GND, while the word line WL of the counting unit 44 is set to the supply potential VDD.

The present implementation of the neuromorphic circuit 10 therefore makes it possible to combine several advantages.

Since most of the components are comprised in the surface occupied by the cell matrix 14, the neuromorphic circuit 10 is less bulky compared with an embodiment wherein each neurone would be formed at the periphery of the cell matrix 14.

Furthermore, the neuromorphic circuit 10 has good integrability in a set of memory cells 26. In fact, the conversion of an initial matrix of memory cells 26 into the neuromorphic circuit 10 is relatively easy since only the connection of the metals from above is affected.

Furthermore, the neuromorphic circuit 10 uses the capacitive bridges 58 and 66, and in each XNOR component, the current flows through a high resistance. Consumption is reduced in this way.

Moreover, the neuromorphic circuit 10 is more robust because same makes it possible to eliminate the variability of the memristors 28 and 30.

The neuromorphic circuit 10 which has just been described can advantageously be organized in banks for performing computations in parallel.

For this purpose, e.g., with reference to FIG. 22, an approach can consist of storing the weights of a neurone on the same line 16 of the cell matrix 14, of activating the word line WL corresponding to the line 16 and of retrieving the result at the output of the neurone 24.

A plurality of neurones 24 can be calculated in parallel by putting the weights of the different neurones on the same line and in succession.

FIG. 22 illustrates an example for the case of an implementation for three input neurones connected to two output neurones. The elements relating to the computation of the value given to the first output neurone are shown in solid lines while the elements relating to the computation of the value given to the first output neurone are shown in dotted lines.

To increase parallelism, it is possible to use the configuration shown in FIG. 23. In such configuration, the source lines SL are cut in the middle of the cell matrix 14 so as to form a plurality of subsets 86 (mini-matrices) within the cell matrix 14 and to allow the subsets 86 thereof to be independently controlled. In the example shown, the number n of subsets 86 is equal to 4.

The n subsets 86 sharing the same word lines WL constitute a group of subsets 88. Each sub-assembly 86 is associated with a neurone 24. Thus, by activating one word line WL per group of subsets 88, it is possible to calculate 2n outputs of neurones 24 in parallel.

Moreover, it could be envisaged to cut the bit-lines BL.

As illustrated in FIG. 24, a configuration with improved parallelism can be envisaged. The neuromorphic circuit 10 thus includes a plurality of sets 90 (two in the case of FIG. 24) each consisting of a plurality of subsets 92 created by interrupting the source lines SL in the middle of the set 90 thereof. Thus, by selecting one word line WL per group of set 94, it is possible to calculate in parallel the outputs of each subset 92. The source lines SL of each subset 92 can be connected to global source lines SL for the writing and reading of the stored weights in a conventional manner.

As is obvious to the person skilled in the art, the writing of the weights in the memristors is carried out in a step prior to a neural calculation operation strictly speaking. Similarly, the values of the weights to be memorized are defined during a training operation of the neural network prior to their writing in memory and therefore prior to the neural calculation during the performance in particular of a neural inference calculation.

Each of the configurations described above can be used for performing computations leading to obtaining the output of a plurality of neurones 24 in parallel and thus to increasing the computational capacities of the neuromorphic circuit 10.

Each of the embodiments which have just been described is compatible with other embodiments of the neurone 24.

In particular, it has been described that the XNOR component 42 is formed by two inverters 48 and 76 in series.

Said inverters may, in a variant, perform another logic operation.

Thus, the first inverter 48 is replaced by a logic unit performing another operation involving an intermediate switching between the ground GND and the supply potential VDD. In other words, the XNOR component 42 includes a logic unit 48 suitable for performing a logic operation which includes a switching between a low value and a high value depending upon the value of the input of the logic unit 48 which is connected to the source line SL. This means that the XNOR component 42 depends solely on the value of the source line SL considered. Otherwise formulated, the logic unit 48 may optionally include other "inputs" than the "input" corresponding to the source line SL, for example in an embodiment such as that described below in connection with FIG. 25, but these possible other inputs must have a neutral value during a neural calculation operation. Consequently, the value at the output of the logic unit 48 depends solely on the value present on the source line SL during a neural calculation operation. Apart from the neural calculation operations, any other inputs of the logic unit 48 can, as is the case in the example in FIG. 25, take non-neutral values so as to participate in establishing the value output of the logic unit which is connected to the capacitive bridge.

Ideally, the switching voltage of the operation performed by such a logic unit is centered around one half of the supply potential, i.e. VDD/2, within a margin, e.g. within 5%.

This means that the logic unit 48 is, in the example described, an inverter or a double inversion (which amounts to the operation performed by a buffer). E.g., the logic unit replacing the first inverter 48 is an XOR gate with an input set to 0. XOR is the name of the logic "exclusive OR" operation.

According to another example, the logic unit replacing the first inverter 48 is a NAND gate with an input set at 1. NAND is the name of the operand "not AND".

According to yet another example, the logic unit replacing the first inverter 48 is a NOR gate with an input set at 0. NOR is the name of the operand "not OR".

According to yet another variant shown in FIG. 25, the counting unit 44 and the comparison voltage generator 64 are both formed by capacitive bridges and each includes an offset capacitor CD.

It should be noted that the counting unit 44 is herein controlled by a string of bits of which number of 1s defines a comparison threshold and hence any comparison threshold can be used.

The offset capacitor CD has a capacitance equal to C/2.

In such a configuration, the equivalent electrical diagram of the counting unit 44 is the diagram shown in FIG. 26.

The counting unit 44 corresponds electrically to a capacitance divider bridge 114 comprising m capacitors 68 on one side and n-m capacitors 68 on the other side. In the preceding notation, n and m are integers, m denoting the number of capacitors 60 connected to an XNOR component 42 having an output corresponding to 1, and n denoting the total number of capacitors 60. The midpoint 116 of the capacitance divider bridge 114 is connected to one terminal of the offset capacitor CD, the other terminal of the offset capacitor CD being at the supply potential VDD.

Since the capacitance divider bridge 114 is connected to the supply potential VDD and to the ground GND, one has:

$$(m + 0.5).\Delta = \frac{m + 0.5}{n + 0.5} VDD$$

Where $\Delta$ is the voltage interthreshold between two states corresponding to two successive values of m.

Similarly, with reference to FIG. 27, the comparison voltage generator 64 corresponds electrically to a capacitance divider bridge 110 comprising m capacitors 60 on one side and n-m capacitors 60 on the other side. The midpoint 112 of the capacitance divider bridge 110 is connected to one terminal of the offset capacitor CD, the other terminal of the offset capacitor CD being connected to the ground GND.

Since the capacitance divider bridge 110 being connected to the supply potential VDD and to the ground GND, with the same notations as before, one has:

$$m.\Delta = \frac{m}{n + 0.5} VDD$$

From the two preceding formulae, two observations arise, on the one hand the interthreshold $\Delta$ is such that $$\Delta = \frac{1}{n + 0.5} VDD$$

and, on the other hand, there is a shift of 0.5 $\Delta$ between the voltage levels of the counting unit 44 and the voltage levels of the comparison voltage generator 46.

As shown in the schematic figure of FIG. 28, a suitable comparison value for each level can be obtained in this way.

In a variant, as shown in FIG. 29, it is possible to use a configuration wherein the thresholds are stored in a cell matrix 118 and can be controlled by selecting the desired word line WL. A desired bit string can be generated in this way.

Finally, from the point of view of a physical implementation, it has been proposed to integrate the neurone 24 on the three lines 16$_1$, 16$_2$ and 16$_3$ of the cell matrix 14, in particular by using RRAM cells for obtaining two components: memristors and capacitors. A gain of space can indeed be obtained in this way.

However, it is also possible to position the neurone 24 at the periphery of the cell matrix 14.

It can be further envisaged to form the elementary cells 12 by using 1T1R cells wherein the source lines would be connected in pairs during the computation. In such a configuration, two 1T1R cells behave during the computation as a 2T2R cell.

Moreover, as has been described, the neuromorphic circuit 10 is well suited for implementation in a plane or a two-dimensional (2D) integrated circuit, i.e. a circuit produced on a single substrate, the electronic components of the circuit being formed next to each other on the substrate.

In a variant, the neuromorphic circuit 10 is produced on a three-dimensional integrated circuit (3D) which corresponds to an electronic circuit, the electronic components of which are distributed in a plurality of distinct layers (levels or substrates) stacked one on top of the other and electrically connected to one another.

In particular, three-dimensional structures with nanowires stacked or with a plurality of tiers, can be envisaged. In the latter case, each line 16 of the cell matrix 14 has the source lines SL thereof connected to a neurone located on the upper tiers. It is then possible to envisage that the source lines SL are connected to each other on the third tiers.

It is further possible to envisage more compact embodiments of the neurone 24 as illustrated schematically in FIG. 30. Compared with the example shown in FIG. 20, the two inverters in series connected to the bridge are eliminated. The inverter function is herein performed by using the switches associated with the memories MV1 and MV2 forming the elements of the bridge.

In this example, the switches are NMOS transistors. Thus, it is intended to add a PMOS transistor 120 at the end of each source line SL. For each column, we therefore have a PMOS transistor 120 the drain of which is connected to a supply Vdd and the gate of which is connected to the source line SL of the column. The source of the PMOS transistor 120 is connected to the drains of the switches connected to the memristors MV1 and MV2 of this same column, the connection being the equivalent of the output of an inverter formed by the PMOS transistor 120 and the two NMOS switches thus mounted in parallel.

Another PMOS transistor can be provided at the end of each source line SL so as to be able to reset the state of the elements of the bridge, i.e. the memristors MV1 and MV2. The supplementary PMOS transistor can be used, when activated, for biasing the source line to VDD and consequently to bias to the ground, the output of the inverter formed by the PMOS transistor 120 and the switches. The two electrodes of each memristor are then biased to Vdd during the phase of resetting the memristor.

As is obvious for the person skilled in the art, these reset operations are carried out prior to a neural calculation operation in which, as previously described in particular in connection with FIGS. 4 and 5, the calculation of popcount is carried out from neuron input values applied to the pairs of complementary bit lines and all the synaptic weights previously programmed (by writing) in the various memory cells based on memristors constituting the synaptic weights.

As only the way of implementing the logic unit 48 is modified, the functioning of the neuromorphic circuit 10 shown in FIG. 30 is similar to what has been described previously.

Moreover, the neuromorphic circuit 10 has the same advantages, to which the following advantages are added.

It is no longer useful to use the cell lines connected to the word lines WL$_2$ and WL$_3$. On the other hand, it is necessary to provide n PMOS transistors in addition to the cell matrix. The surface area occupied by the neurone 24 is overall smaller.

Such variant is also interesting because the physical implementation of the inversion by a "true CMOS inverter" consisting of a PMOS transistor and an NMOS transistor (the two switches in parallel) can be used for achieving an inversion of better quality. As a result, a better immunity can be obtained with respect to the variability of the memristors, and therefore a better reliability of the computations performed.

Moreover, it is no longer useful to implement the procedure for changing from unformed 2T2R cells to two inverters as described with reference to FIGS. 17 to 19.

The implementation of the neuromorphic circuit 10 becomes simpler in this way.

According to a variant, instead of using a second capacitive bridge to generate the threshold, it can be used to produce the double capacitive bridge represented in FIG. 5, it is possible to add an extension to the double capacitive bridge and to the matrix of memory cells to be able to adjust the threshold T$_i$ of the neuron to a desired value, other than the mid-power level V$_{DD}$/2.

To do this, it is possible to use bias units 200, each bias unit 200 corresponding to a set of two bias capacitors mounted in differential (with an inverter) according to a structure similar to that described above. It is possible to set each unit of bias 200 to 1 by connecting one of the two bias capacitors to the power supply or to 0 by connecting for the considered bias capacitor to ground capacitive bridge.

As visible in FIG. 30, each bias unit 200 is connected to an additional column and is controlled by a set of 2T2R cells connected to a pair of complementary bit lines BL, BLb and an additional source line SL. In this case, only the column connected to a bias unit 200 is shown in FIG. 31. Also, as with the other columns of the matrix, a logical unit is placed between each additional column and each bias unit 200.

Thus, it is possible to set each unit of bias 200 to 1 (respectively to 0) by programming the memory cells of these additional columns similar to what was described previously by checking the state of the memristors. A unit of bias 200 is said to be "set to "1" or "0"" when the output of the inverter at the bottom of the column delivers, for example, respectively a voltage value V$_{DD}$ or gnd.

The units of bias 200 make it possible to shift the threshold of the neuron around VDD/2 as will be explained in the diagrams of FIGS. 32 to 34.

As a reminder, the aforementioned calculation function expressed in voltages is written:

$$a_i = \text{sign}\left[\frac{V_{DD}}{n}[popcount_j(XNOR(W_{ij}, a_j))] - T_i\right]$$

-continued $$\text{with } T_i = \frac{V_{DD}}{2}$$

Taking into account the units of bias 200, it becomes:

$$a_i = \text{sign}\left[\frac{V_{DD}}{n+b}[popcount_j(XNOR(W_{ij}, a_j))] - T_i'\right]$$

$$\text{with } T_i' = \frac{V_{DD}}{2} - \frac{V_{DD}}{n+b} * k_i$$

Where:

$k_i$ corresponds to the number of bias units 200 to 1, and b is the number of total bias 200 units.

The same equation expressed in the domain of integers gives:

$$a_i = \text{sign}[[popcount_j(XNOR(W_{ij}, a_j))] - T_i]$$

$$\text{with } T_i = \frac{n}{2} + \frac{b}{2} - k_i$$

In this diagram, five elements for counting unit 44 (corresponding to five input "synaptic branches" of the same neuron in the previous layer) are represented. As described previously, each element of the counting unit 44 can take the value 1 or 0 depending on the voltage level present at the output of the inverter connected to the element. Thus, the signal present on the charge pooling line connected to the + input of the comparator 62 can take on a voltage value from among a set of 6 possible values, which we will call V1, V2, V3, V4, V5 and V6. In other words, this signal (on the + input) actually corresponds to the result of the popcount operation. The result of the popcount can also be expressed as an integer, with for example the integer value 0 corresponding to the voltage V1, the integer value 1 corresponding to V2, and so on until the integer value 5 corresponding to V6.

It will be noted that the units of bias 200 are always at the same logic control value for a given neuron (or in other words, for the same selected line). Consequently, regardless of their number, it does not change the number of possible voltage values on the "popcount" signal (on the + input). On the other hand, the choice of the value assigned to each unit of bias 200 will impact the voltage levels corresponding to the 6 values V1 to V6.

In the absence of bias units 200, the values V1 to V6 correspond for example respectively to 0 V, $V_{DD}/5$, $2*V_{DD}/5$ and so on until V6=$V_{DD}$. With two units of bias 200 at "1", the values V1 to V6 then correspond respectively to (2/7) $*V_{DD}$, (3/7)$*V_{DD}$ etc. . . . up to $V_{DD}$. With two units of bias 200 at "0", the values V1 to V6 then correspond respectively to 0, (1/7)$*V_{DD}$, (2/7)$*V_{DD}$, up to (5/7)$*V_{DD}$.

The comparison performed by the comparator 62 corresponds to the performance of the sign( ) function in the aforementioned equations, as well as to the operation of subtracting the threshold value Ti. In the case of a differential capacitive bridge such as that represented in FIG. 32, the output of the comparator 62 will be high or low depending respectively on whether the + input (terminal 62E1) is higher or lower than the − input (terminal 62E1) of the comparator 62. In other words, if the voltage on the popcount signal (input +) is greater than $V_{DD}/2$ the output of the comparator 62 is worth "1" and if it is less than $V_{DD}/2$ the output of the comparator 62 is worth 0.

In the absence of 200 units of bias, the values V1 to V6 are distributed symmetrically around $V_{DD}/2$ and the result of the comparison gives the result of the function sign(popcount) with a threshold Ti equal to $V_{DD}/2$ if the popcount signal is expressed in volts, or in other words with an equivalent threshold Ti equal to 2.5 if the popcount signal is expressed as a corresponding whole number between 0 and 5.

With bias units 200, the values V1 to V6 are distributed differently on either side of $V_{DD}/2$. In the first example mentioned above (2 units of bias 200 to "1"), we thus have 2 values V1 and V2 lower than $V_{DD}/2$ and 4 values V3 to V6 higher than $V_{DD}/2$. The result of the comparison therefore gives the result of sign(popcount− Ti), with the threshold Ti=(3/14) $V_{DD}$ Volt.

With 2 units of bias 200, it is thus possible to obtain 3 distinct threshold values Ti.

More generally, with m units of bias 200, m+1 thresholds are obtained. The value of these thresholds depends in practice on the number of "input" branches of the neuron, in other words the number of columns used to produce the neuron and the number of bias unit(s) 200.

This makes it possible to have an easy-to-build structure that can provide different threshold values from the VDD/2 mid-power supply. In practice, if the number of columns connected to the neuron is high, the threshold voltage Ti' can be varied around $V_{DD}/2$ with a few additional units of bias 200. This is in practice largely sufficient, because in the majority of applications the desired threshold value Ti' will be equal to or close to $V_{DD}/2$.

In addition, this makes it possible to consider a more "complete" training of a neural network by adding the possibility of also training the threshold values in addition to the weight values.

In all the embodiments described previously, the "input" and "output" values of each neuron were coded on a single bit. In this sense, the neuromorphic circuit 10 produces a purely binary neural network, namely binary input and binary output.

However, the neuromorphic circuit 10 can also be modified to take "multi-bit" values as input, that is to say values coded over several bits (each bit being able to take 2 possible values) and output a value binary. In such a case, the neural network produced by the neuromorphic circuit 10 can be qualified as a neural network with binary output.

To do this, as indicated above, at the level of a neuron, we want to perform an operation that can be written:

$$a_i = \text{sign}[popcount_j(XNOR(W_{ij}, a_j)) - T_i]$$

in which the popcount operation is written:

$$popcount_j(XNOR(W_{ij}, x_j)) = \frac{V_{DD}}{n} * \sum_{j=1}^{n} x_j \odot W_{ij}$$

The integer n designates here the number of synaptic neuron branches (or number of columns) to which neuron i is connected.

Moreover, in this expression, to simplify the understanding of what will follow, for the inputs of the neuron, instead of using the notation "$a_j$" which can lead to confusion with the notation "$a_i$", the notation will be used "$x_j$" for inputs. This "$x_j$" notation makes it possible to clearly differentiate these inputs from the "$a_i$" outputs.

The operator ⊙ designates the bitwise multiplication performed by an XNOR gate, so that it comes:

$$popcount_j(XNOR(W_{ij}, x_j))^{<k>} = \sum_{j=1}^{n} x_j^{<k>} \odot W_{ij}^{<k>}$$

Where:

x_j^{<k>} designates the k-th bit of the j-th input of the neurone, and

W_{ij}^{<k>} designates the k-th bit of binary weight of the j-thpoids binaire pour la input of the neuronek being able to vary from 1 to m varier de 1 á m, m designating the total number of bits for each input x_j.

However, as shown schematically in FIG. 35 which aims to schematize the circuits exposed previously for an example with 5 synaptic branches per neuron and 1 single bit, for each input (on each pair of bit lines BL and BLb), the circuit neuromorphic 10 comprises a first part 204 performing the popcount function and a second part 206 performing the operation sign and subtraction of the threshold Ti.

Rather than representing each component of the first part 204 in full, a representation is used in which we see a table with boxes memorizing a weight (respectively $w_{i1}$, $\overline{w_{i1}}$ and so on until $\overline{w_{i5}}$). Each entry ($x_1$ to $\overline{x_5}$) is to be multiplied with a weight indicated by a respective arrow pointing towards the bottom of the figure and touching the box of the weight.

This simplified representation shows that the circuits exposed previously allow with the notations used in this paragraph that it is easy to carry out easily only the following weighted summation operation:

$$x_1 \cdot w_{i1} + x_2 \cdot w_{i2} + x_3 \cdot w_{i3} + x_4 \cdot w_{i4} + x_5 \cdot w_{i5}$$

It will be noted that in such an operation, a single bit is taken into account for each value $x_j$.

Therefore, to reuse the previous neuromorphic circuits, it will first be necessary to implement the sum over j (included between 0 and n the number of columns/synapses) and then the sum over k (included between 1 and m), from so that the operation of the operation of popcount is written:

$$popcount_j(XNOR(W_{ij}, x_j)) = \frac{V_{DD}}{n} * \frac{1}{2^{m+1}} \sum_{k=1}^{m} 2^k * \sum_{j=1}^{n} x_j^{(k)} \odot W_{ij}^{(k)}$$

Where m denotes the total number of bits for each input $x_j$.

Such an operation can be implemented according to sequential implementation, for example by means of the implementation proposed in FIG. 36 described in a simple example with 5 synapses (n=5) with 8 bits (m=8) for each input $x_j$.

By reusing a tabular representation similar to that of FIG. 35, in this case a weight is used for each k-th bit of an input data xj instead of a single weight. This leads for the input $x_1$ to a column with successively $W_{i1}^{<1>}$, $W_{i1}^{<2>}$ ... $W_{i1}^{<8>}$, i.e. to perform the calculation of the multiplications of each of these weights by each value of the corresponding bit of the corresponding input $x_1$. Thus, it is calculated $x_1^{<1>} * W_{i1}^{<1>}$, then $x_1^{<2>} * W_{i1}^{<2>}$ and so on until $x_1^{<8>} * W_{i1}^{<8>}$. As in the examples described previously, this calculation requires in practice the use of complementary bit lines BL and BLb connected to memory cells storing complementary values in the two memristors of each memory cell. Thus, the second column, as before, stores the complementary weight values ($\overline{W_{i1}}^{<1>}$, $\overline{W_{i1}}^{<2>}$ ... $\overline{W_{i1}}^{<8>}$) and receives values from complementary data ($\overline{x_1}^{<1>}$, ..., $\overline{x_1}^{<8>}$). The circuit thus makes it possible to obtain at output all the results of each of the operations of the type $x_j^{<k>} * W_{ij}^{<k>}$ and this, in a sequential manner.

It is still necessary to accumulate these elements which arrive sequentially. This is the role of the counting device 208 at the output of the first part 204.

The counting device 208 comprises a first unit 210 of transfer followed by a second accumulation unit 212.

For this, the first transfer unit 210 comprises a first switch S1 and a capacitor, called transfer capacitor 214, and while the second unit 212 comprises a second switch S2 and another capacitor, called capacitor of accumulation 216.

An example of operation of the counting device 208 is now described.

Prior to the operations described below, the two capacitors 214 and 216 are reset, and in the example described here, the charges are removed at the terminals of capacitors 214 and 216 so that a zero voltage is present at their terminals.

The first part 204 first performs operations of the type $x_j^{<1>} * W_{ij}^{<1>}$ with the two switches S1 and S2 open. These operations are carried out by selecting a first line storing the weights with the index k=1.

Then, the first switch S1 is closed to transfer the result of the operations to the transfer capacitor 214 which stores a charge corresponding to a voltage value coding for the result of the sum over j of the $x_j^{<1>} * W_{ij}^{<1>}$.

The first switch S1 is then opened so that the first part 204 can perform new operations, here operations of the type $x_j^{<2>} * W_{ij}^{<2>}$, by selecting the line storing the weights with the index k=2.

During this time, the second switch S2 is closed so that the transfer capacitor 214 and the accumulation capacitor 216 are connected.

Accumulation capacitor 216 thus charges to a charge corresponding to half the value of the voltage of transfer capacitor 214, i.e.:

$$\frac{V_{DD}}{n} * \frac{1}{2} \sum_{j=1}^{n} x_j^{(1)} * W_{ij}^{(1)}$$

Then, the second switch S2 is opened again and the transfer capacitor 214 is reset to 0.

The first switch S1 then goes into the closed state and thus the transfer capacitor 214 is charged to a charge corresponding to a voltage value coding for the result of $\Sigma_{j=1}^{n} x_j^{<2>} * W_{ij}^{<2>}$, the operations of type $x_j^{<2>} * W_{ij}^{<2>}$ having just been carried out by the first part 204.

The first switch S1 is then opened so that the first part 204 continues to perform operations, here operations of the type $x_j^{<3>} * W_{ij}^{<3>}$.

During this time, the second switch S2 is closed so that the transfer capacitor 214 and the accumulation capacitor 216 are connected.

Accumulation capacitor 216 thus charges to a charge corresponding to:

$$\frac{V_{DD}}{n} * \left[ \frac{1}{2} \left( \frac{1}{2} \sum_{j=1}^{n} x_j^{(1)} * W_{ij}^{(1)} + \sum_{j=1}^{n} x_j^{(2)} * W_{ij}^{(2)} \right) \right] =$$

-continued $$\frac{V_{DD}}{n} * \left[ \frac{1}{4} \sum_{j=1}^{n} x_j^{(1)} * W_{ij}^{(1)} + \frac{1}{2} \sum_{j=1}^{n} x_j^{(2)} * W_{ij}^{(2)} \right].$$

And so on until the operations of the type $x_j^{<8>}*W_{ij}^{<8>}$ to obtain a charge on the accumulation capacitor 216 corresponding to:

$$\frac{V_{DD}}{n} * \frac{1}{2^{m+1}} \sum_{k=1}^{m} 2^k * \sum_{j=1}^{n} x_j^{(k)} * W_{ij}^{(k)}$$

Once the accumulation is complete, the comparator 206 compares the voltage present on the accumulation capacitor 216 with a reference voltage which is chosen according to a threshold $T_i$ which it is desired to apply in the realization of the subtraction (with $T_i$), the result of the comparison carried out by the comparator 206 being the output value $a_i$.

In such an embodiment, the charge values that the transfer capacitor 210 can take are very numerous, and by extension the number of possible charge values on the accumulation capacitor 216 after m transfers can quickly become very high if the number of entries n is high. It follows that the discrimination by the comparator 206 between two successive possible values, necessarily close to each other, can be made difficult in practice or can require a very precise and therefore bulky and energy-consuming comparator.

To remedy this problem, according to a variant illustrated by FIG. 37, a second comparator 220 is inserted upstream of the counting device 208.

The second comparator 220 performs a comparison with a threshold noted $T_{ki}$.

Using the previous notations, this leads to the following operation:

$$a_1 = \mathrm{sign}\left( \frac{1}{2^{m+1}} \sum_{k=1}^{m} 2^k * \mathrm{sign}\left( \frac{V_{DD}}{n} \sum_{j=1}^{n} x_j^{(k)} * W_{ij}^{(k)} - T_{ki} \right) - T_i \right)$$

The reference voltage applied to the − input of the comparator 206 is a function of the threshold $T_{ki}$. According to a simplest embodiment, the same reference voltage value is applied throughout the iterative process explained above (with the successive selection of the m lines).

Transfer capacitor 214 will in this example take on one of two possible values, namely $V_{DD}$ or Gnd. Consequently, the accumulation capacitor 216 will be able to take, at the end of the m accumulation cycles, one value from among 129 possible values in the case m=8 (if the two capacitors 214 and 216 have the same capacity), which can make it easier to discriminate between two successive levels by a poorly optimized comparator, of small size.

According to yet another variant corresponding to FIG. 3738, while retaining the second comparator 220, the first unit 210 and the second unit 212 are produced according to a differential circuit.

This means that each of the two units 210 and 212 comprise the same switches and similar capacitors placed opposite each other and a comparator 220 along two channels.

Such a variant makes it possible to obtain better robustness conferred by the differential assembly in terms of discrimination between several levels, at the level of the second comparator 220 while having a "single" and non-differential capacitive bridge in the part 204 which makes it possible to limit the size of this part 204 because its size can quickly become large in the case of a differential bridge with a high number of columns.

According to a variant of the two embodiments represented respectively in FIGS. 37 and 38, it is possibly possible not to provide the accumulation capacitor 216 and the comparator 206 and to use in practice only the comparator 220 to supply a sequence of values. binary values at the output of the neuron, this series of m binary values (on 1 bit) forming the equivalent of a "multi-bit" binary value at the output of the neuron.

Furthermore, according to a variant of the diagram represented in FIG. 25, it is possible to provide a device for reinitializing the capacitive bridge which is different. In such a variant, the AND gates are eliminated and the outputs of the inverters are directly connected to the capacitors on each side of the capacitive bridge. During a reset operation, a device for controlling the bias of each SL source line of the matrix applies a zero voltage (GND) on the SLs, so that the "right" inverters (connected to the capacitors linked by elsewhere to the positive input of the comparator 62) present an output voltage equal to $V_{DD}$ and the "left" inverters (connected to the capacitors connected elsewhere to the negative input of the comparator) present an output voltage equal to Gnd. The "right" NMOS transistor 82 (the one connected to the positive input of the comparator) is replaced by a PMOS transistor 82' whose source is connected to $V_{DD}$ and the drain connected to the common line of the "right" capacitors (which is connected to the positive input of the comparator). Thus, during a reset operation, prior to a neural calculation operation, the capacitors on the left see a zero voltage on each of their terminals and the capacitors on the right see a voltage equal to $V_{DD}$ on each of their terminals; which leads to the discharge of charges in all of the capacitors. It will be noted that the polarization control device of each line SL is of course rendered inoperative during a neural calculation operation (its output being for example placed in a high impedance state so as not to conduct a disturbing current).

In all the embodiments presented, there has thus been presented an implementation of a neural network which can be made compact and has low power consumption.

The invention claimed is:

1. A neuromorphic circuit suitable for implementing a neural network with binary output, the neuromorphic circuit comprising:
    word lines,
    pairs of complementary bit-lines,
    source lines,
    a set of elementary cells organized according to a two-dimensional matrix comprising rows and columns,
    the set of elementary cells including a storage assembly grouping together a set of lines of elementary cells, the elementary cells of the storage assembly being memory cells, where memory cells of the same line can be selected by a word line, the memory cells of the same column being connected to a pair of complementary bit-lines and a source line,
    each memory cell comprising two memristors and two switches, each memristor being connected to the same source line and to a corresponding switch, each memristor storing a weight or an inverse of the same weight, respectively, and having different first and second resistance values, respectively, the switches being connected for activation thereof, to a word line and correspondingly connected to a pair of complementary bit-lines, each pair of complementary bit lines receiving complementary input voltages during a neural calculation operation, an electronic circuit implementing a neurone having an output and including:

a set of logic components, each logic component having a logic unit comprising an input connected to a corresponding source line, the logic unit being suitable for performing a logic operation which switches between a low value and a high value depending only on a value of the input of the logic unit which is connected to the source line during said neuronal calculation operation, each logic unit performing a logic function such as an inverter or a double inverter, a counting unit, the counting unit being suitable for counting a number of high or low values at an output of the logic components, the counting unit being a bridge, a bridge being a set of the same elements in parallel and connected to each other at one of terminals thereof to an output of the counting unit, each element being connected to a corresponding logic component and being a resistor or a capacitor, and a comparison unit comprising a comparator and a comparison voltage generator, the comparator being suitable for comparing the output of the counting unit with a comparison voltage generated by the comparison voltage generator so as to output a signal depending on the comparison and corresponding to the output of the electronic circuit implementing a neurone.

2. The neuromorphic circuit according to claim 1, wherein each memristor has a virgin state, the counting unit being a line of elementary cells, each elementary cell of the counting unit being a cell comprising two memristors in the virgin state and two switches, each memristor in the virgin state being connected to the other memristor in the virgin state and to a corresponding switch, the switches being connected to each other.

3. The neuromorphic circuit according to claim 1, wherein each logic unit comprises an inverter formed from an elementary cell comprising two memristors and two switches, each memristor being connected to the other memristor and to a corresponding switch, a short-circuit track being arranged for short-circuiting the two memristors, one of the switches being connected to ground and to the input of the logic unit for the control thereof and the other switch being connected to a supply potential and mounted as a diode.

4. The neuromorphic circuit according to claim 1, wherein each logic unit comprises an inverter formed from an elementary cell comprising two memristors and two switches, each memristor being connected to the other memristor and to a corresponding switch, a first switch being connected to the ground and to the input of the logic unit for the control thereof and the second switch being connected to a supply potential and mounted as a diode, a short-circuit track being arranged for short-circuiting the memristor connected to the first switch.

5. The neuromorphic circuit according to claim 1, comprising a first controller for selecting the elementary cells of a line which are connected to a same word line, and comprising a second controller connected to the pairs of bit-lines and used for applying different voltages to each pair of bit-lines and symmetrical with respect to a middle voltage, where a voltage applied to a bit-line is either higher or lower than a voltage applied to the associated complementary bit-line depending on a value of an input signal, each input signal corresponding to an input of a synapse connected to said neurone.

6. The neuromorphic circuit according to claim 5, wherein the set formed by each logic unit is formed from at least one line of elementary cells not belonging to the storage assembly.

7. The neuromorphic circuit according to claim 2, wherein each logic unit corresponds to an inverter formed of said switches of each elementary cell of the counting unit and a PMOS transistor a drain of which is connected to a supply voltage, a gate of which is connected to a source line SL and a source of which is connected to drains of said switches.

8. The neuromorphic circuit according to claim 1, wherein the comparison voltage generator is a fixed voltage generator.

9. The neuromorphic circuit according to claim 1, wherein the comparison voltage generator is a second bridge having the same elements as the counting unit, each element of the second bridge being connected to an inverter connected to a corresponding logic unit.

10. The neuromorphic circuit according to claim 9, wherein the elements of the two bridges are capacitors having the same capacitance, the comparison voltage generator and the counting unit having an offset capacitor, the offset capacitor having a capacitance equal to one half of the capacitance of a capacitor of one of the two bridges.

11. The neuromorphic circuit according to claim 1, wherein the logic operation performed by each logic unit is selected from: an exclusive-or with an input set to 0, an inversion, a non—and with one of the two inputs set to 1, a non—or with one of the two inputs set to 0.

12. The neuromorphic circuit according to claim 1, wherein the neuromorphic circuit includes pull-down transistors, one of the pull-down transistors being connected to all of the elements of the counting unit and the other of the pull-down transistors being connected to a corresponding source line, the pull-down transistors being suitable for erasing the elements.

13. The neuromorphic circuit according to claim 1, wherein the neuromorphic circuit includes a plurality of distinct sets of elementary cells suitable for working in parallel.

14. The neuromorphic circuit according to claim 13, wherein the source lines have a plurality of portions, where portions of the lines are specific to a set of elementary cells.

15. The neuromorphic circuit of claim 1, wherein the neuromorphic circuit is a three-dimensional integrated circuit.

* * * * *